US012563852B2

(12) United States Patent
Liu et al.

(10) Patent No.: US 12,563,852 B2
(45) Date of Patent: Feb. 24, 2026

(54) UNIFORM TRENCHES IN SEMICONDUCTOR DEVICES AND MANUFACTURING METHOD THEREOF

(71) Applicant: Taiwan Semiconductor Manufacturing Co., Ltd., Hsinchu (TW)

(72) Inventors: Ming Chyi Liu, Hsinchu (TW); Jiech-Fun Lu, Tainan County (TW); Hung-Wen Hsu, Tainan (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 671 days.

(21) Appl. No.: 17/810,498

(22) Filed: Jul. 1, 2022

(65) Prior Publication Data

US 2023/0230993 A1 Jul. 20, 2023

Related U.S. Application Data

(60) Provisional application No. 63/301,265, filed on Jan. 20, 2022.

(51) Int. Cl.
*H10F 39/00* (2025.01)
*H10F 39/12* (2025.01)

(52) U.S. Cl.
CPC ......... *H10F 39/807* (2025.01); *H10F 39/024* (2025.01); *H10F 39/809* (2025.01)

(58) Field of Classification Search
CPC ..... H10F 39/087; H10F 39/809; H10F 39/199
See application file for complete search history.

(56) References Cited

U.S. PATENT DOCUMENTS

| | | | | |
|---|---|---|---|---|
| 10,297,555 B2 * | 5/2019 | Kuan | ................ | H10D 84/0151 |
| 2017/0092643 A1 | 3/2017 | Tseng et al. | | |
| 2018/0166321 A1 | 6/2018 | Sun et al. | | |
| 2019/0131340 A1 | 5/2019 | Kim et al. | | |
| 2020/0303435 A1 | 9/2020 | Wei et al. | | |
| 2021/0193702 A1 | 6/2021 | Zang et al. | | |
| 2022/0068981 A1 * | 3/2022 | Jung | .................... | H10F 39/024 |

(Continued)

FOREIGN PATENT DOCUMENTS

| | | |
|---|---|---|
| CN | 114843299 A | 8/2022 |
| EP | 3067919 A1 | 9/2016 |
| JP | 2002-100675 A | 4/2002 |

(Continued)

OTHER PUBLICATIONS

Request for the Submission of an Opinion, Feb. 6, 2025, 5 pages, Application No. 10-2023-0007852, Korea.

*Primary Examiner* — David Vu
*Assistant Examiner* — Brandon C Fox
(74) *Attorney, Agent, or Firm* — Sterne, Kessler, Goldstein & Fox P.L.L.C.

(57) ABSTRACT

The present disclosure describes a semiconductor device having radiation-sensing regions separated by trench isolation structures. The semiconductor structure includes a first trench fill structure on a substrate and a second trench fill structure on the substrate. The first trench fill structure has a first width and a convex bottom surface. The second trench fill structure has a concave bottom surface and a second width greater than the first width.

20 Claims, 22 Drawing Sheets

(56)     References Cited

U.S. PATENT DOCUMENTS

| 2022/0077204 | A1* | 3/2022 | Lee | ......................... | H10F 39/802 |
| 2022/0415936 | A1* | 12/2022 | Jeon | ....................... | H10F 39/182 |

FOREIGN PATENT DOCUMENTS

| JP | 2000-156402 | A | 6/2002 | | |
| JP | 2005-251945 | A | 9/2005 | | |
| JP | 2007-513782 | A | 5/2007 | | |
| JP | 2007234761 | A | 9/2007 | | |
| JP | 2009-021489 | A | 1/2009 | | |
| JP | 2019-140251 | A | 8/2019 | | |
| KR | 1020180068860 | A | 6/2018 | | |
| WO | WO-2021199681 | A1 * | 10/2021 | ........... | G01S 7/4863 |

* cited by examiner

600

Form, on a substrate, a first pattern having a first width and a second pattern having a second width greater than the first width ~610

Form, within the second pattern, a third pattern having a third width less than the second width ~620

Form, on the substrate, a first trench under the first pattern and a second trench under the second and third patterns ~630

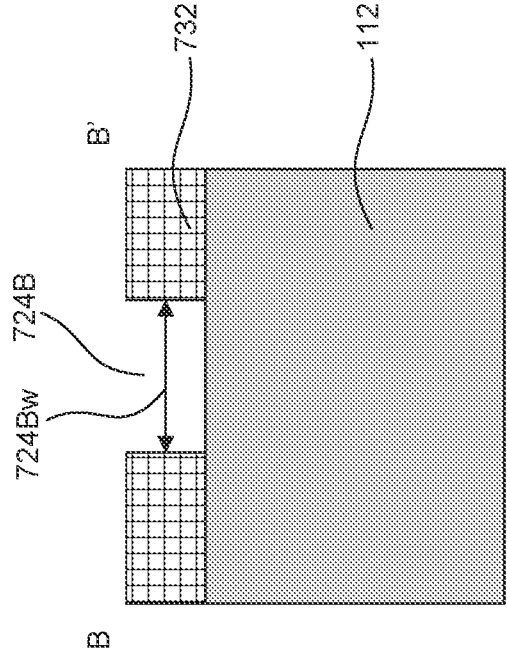
FIG. 8A
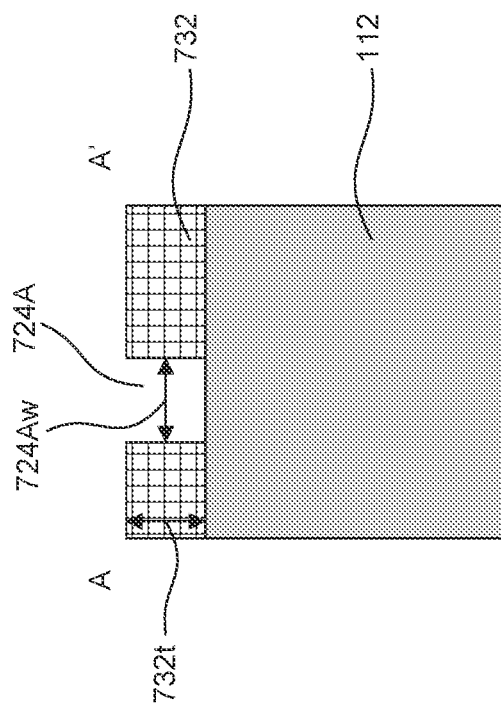
FIG. 8B
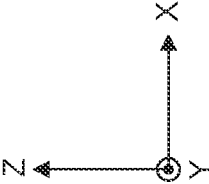

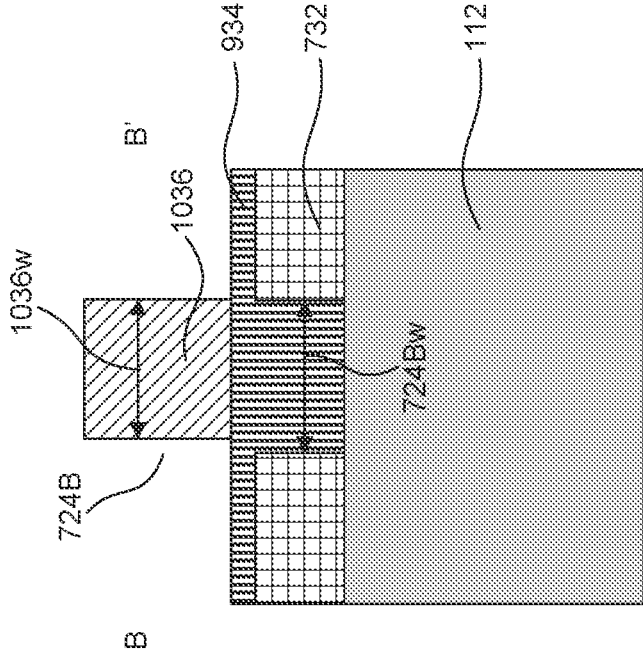
FIG. 10B
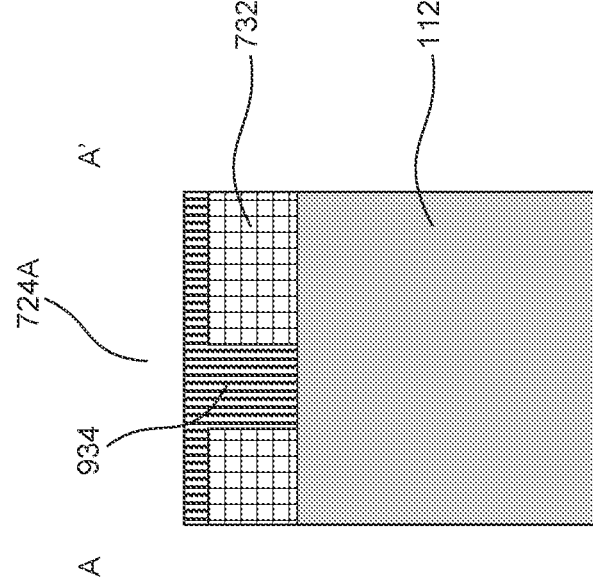
FIG. 10A
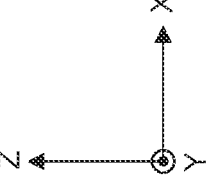

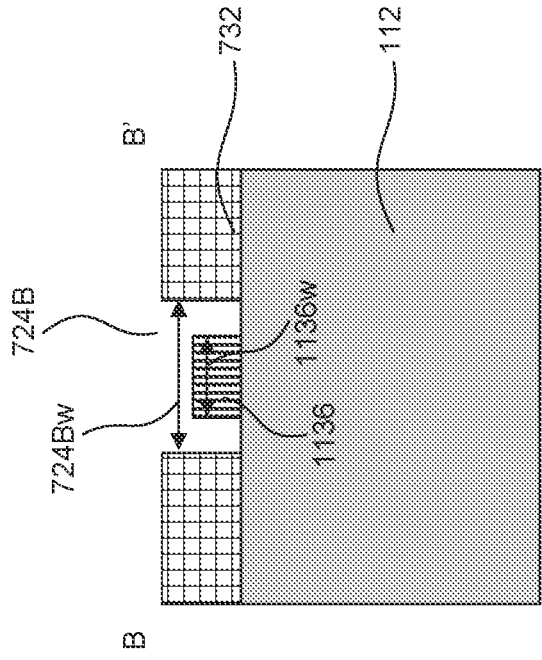
FIG. 11A
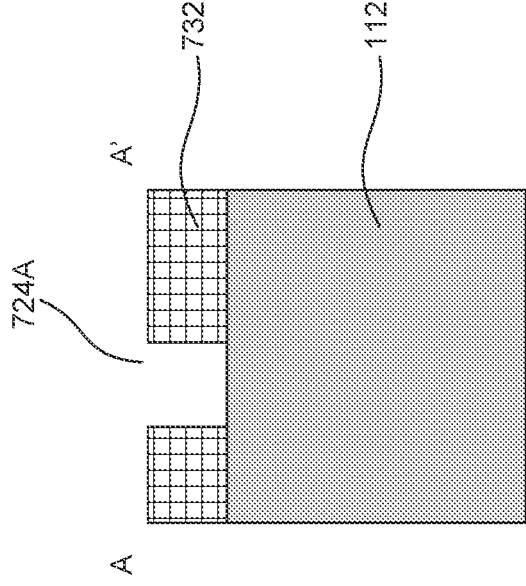
FIG. 11B
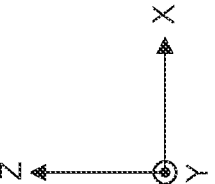

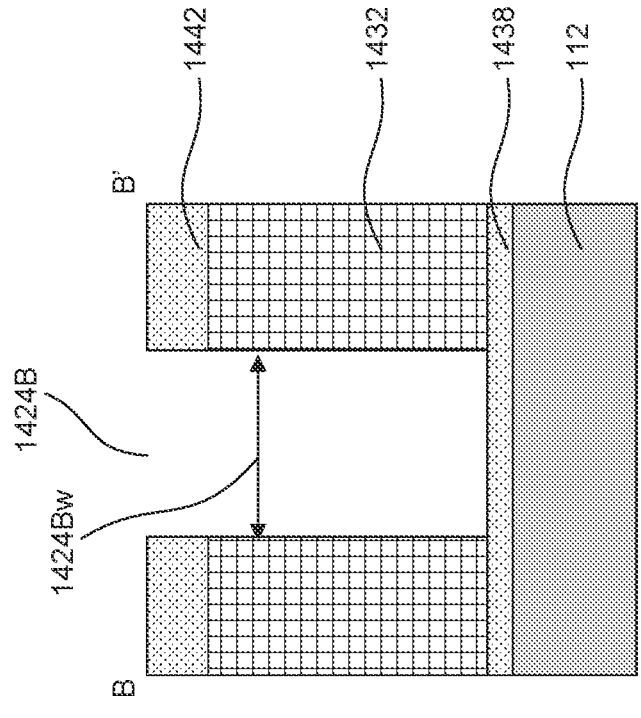
FIG. 15B
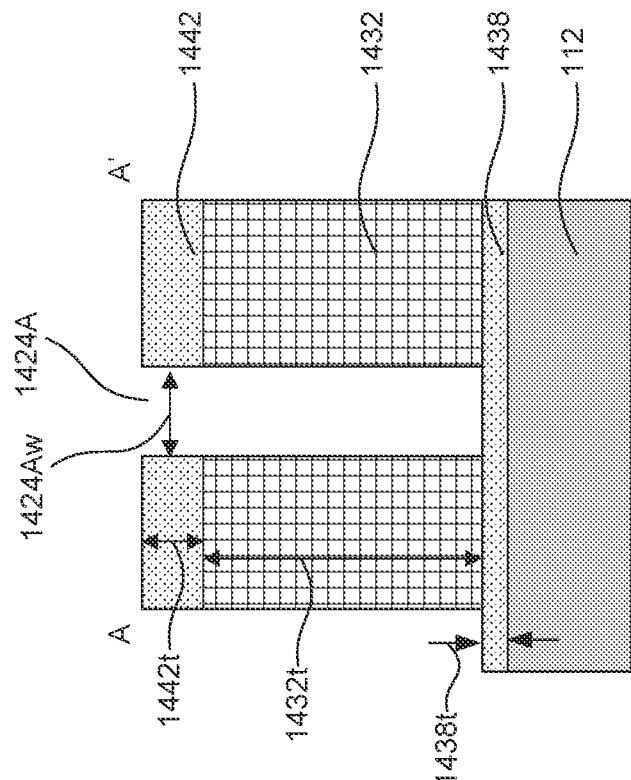
FIG. 15A
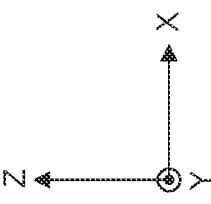

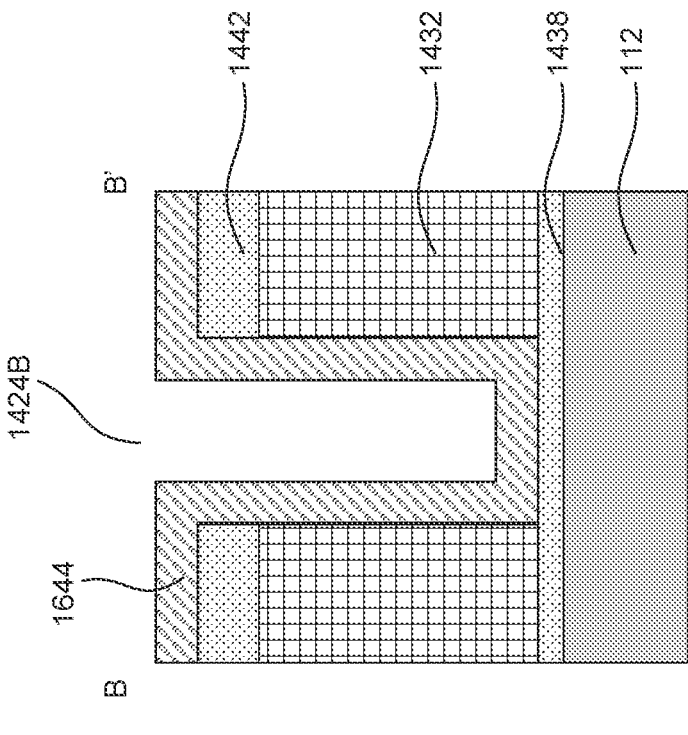
FIG. 16B
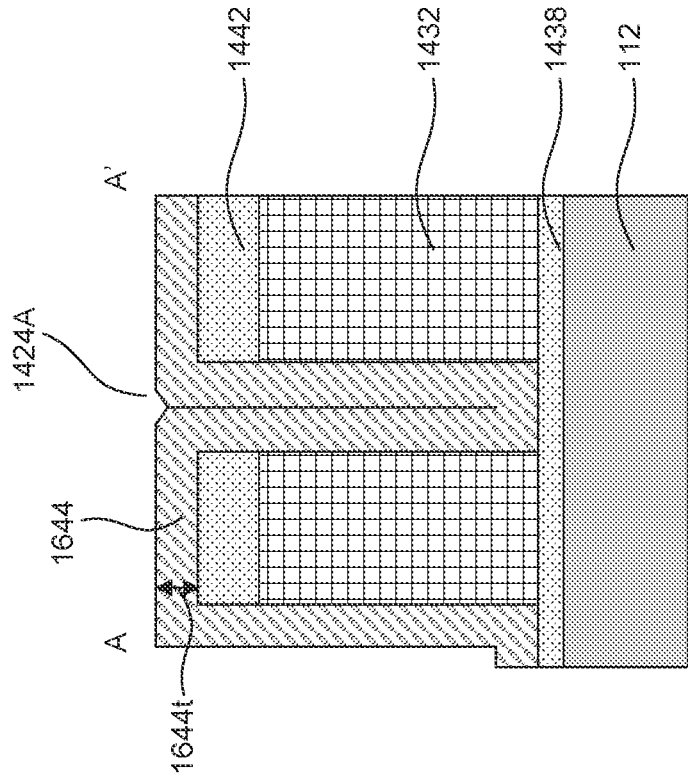
FIG. 16A
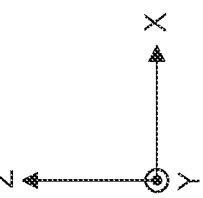

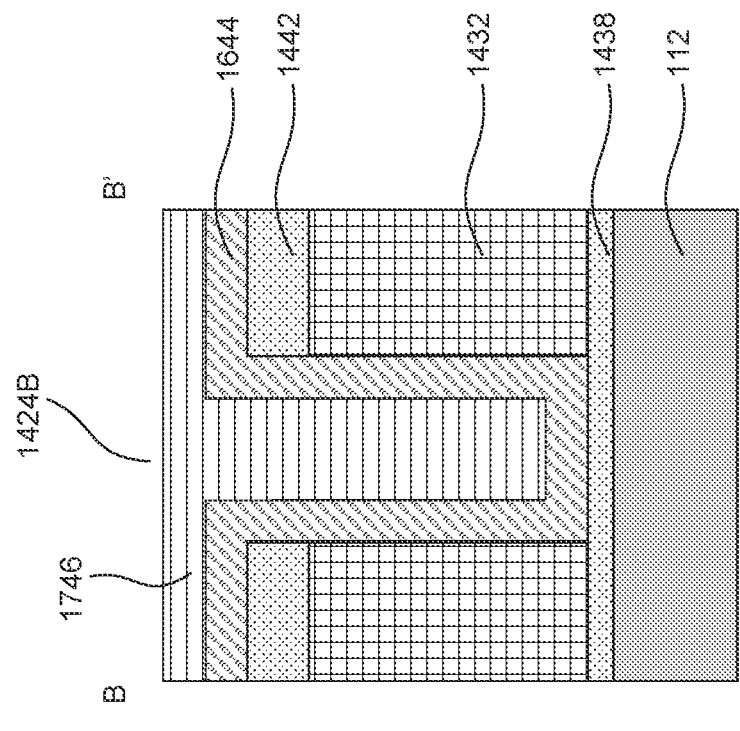
FIG. 17B
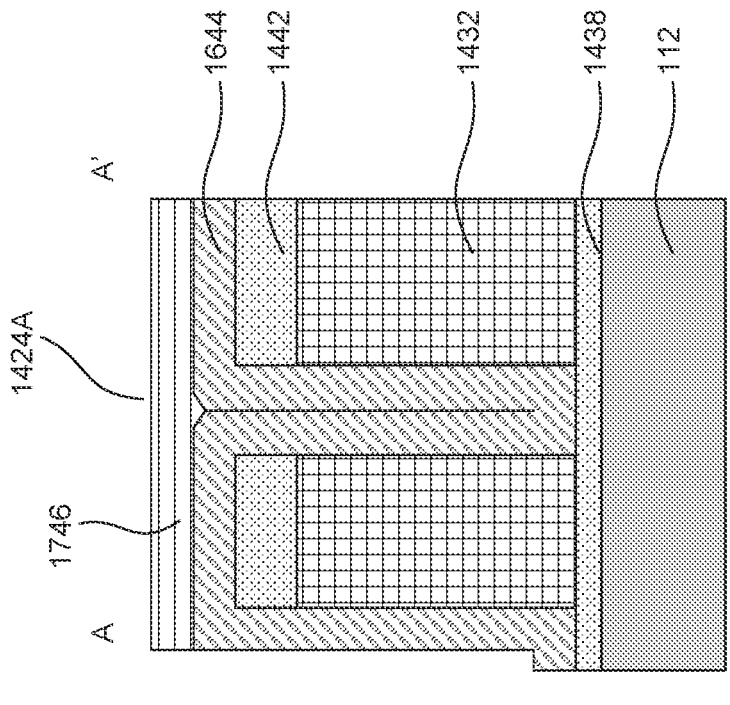
FIG. 17A
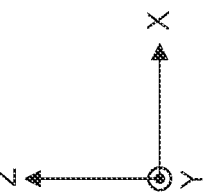

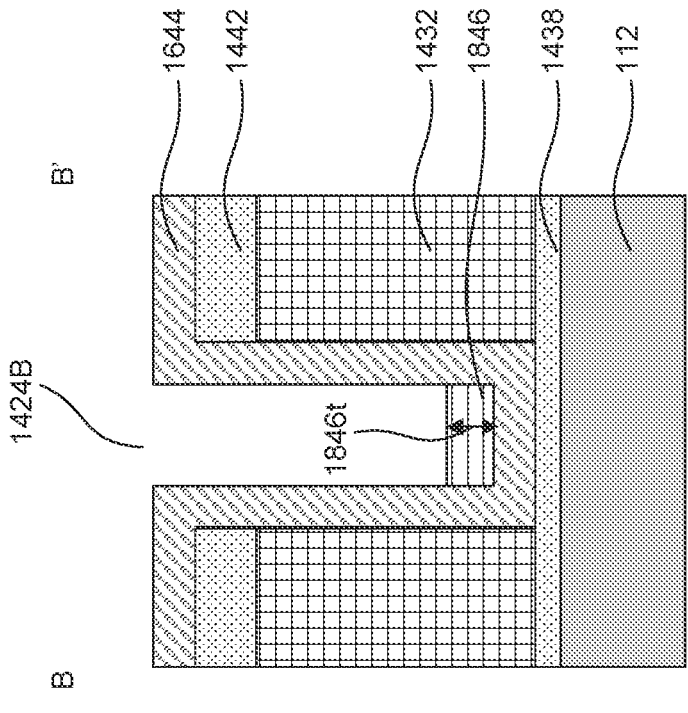
FIG. 18B
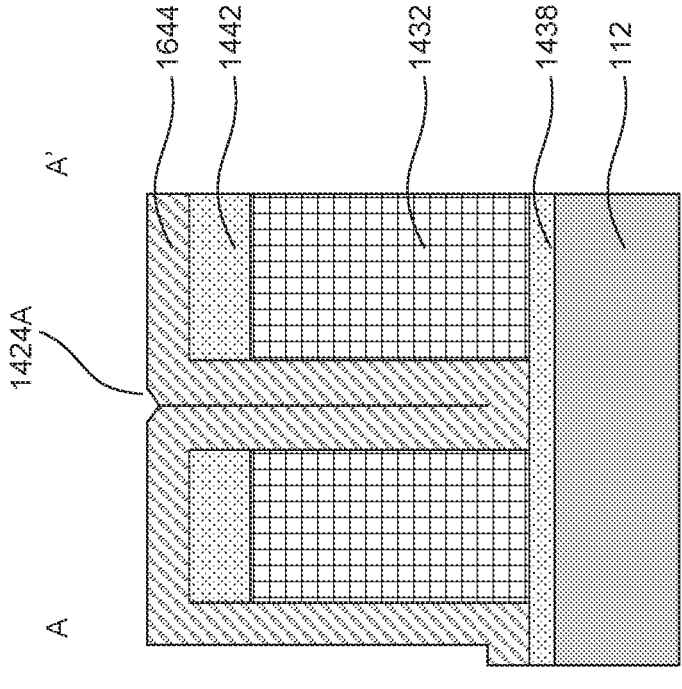
FIG. 18A
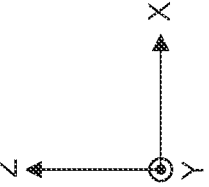

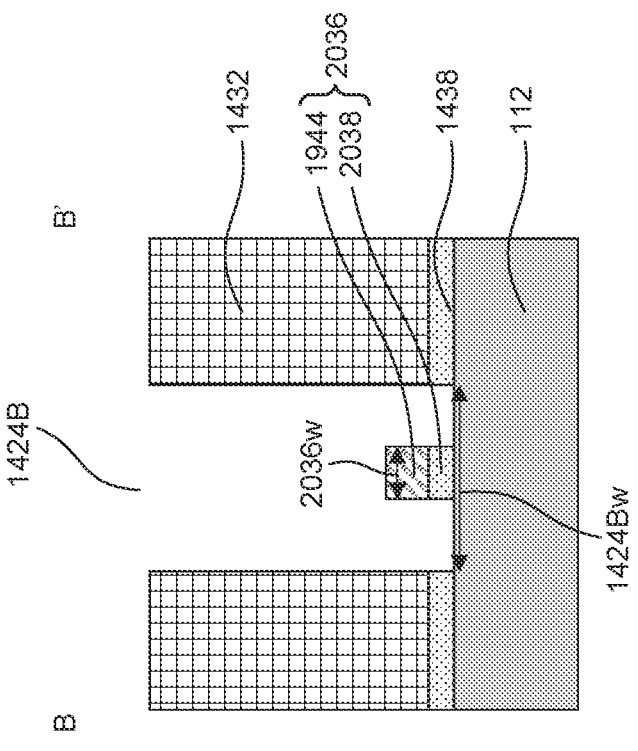
FIG. 20B
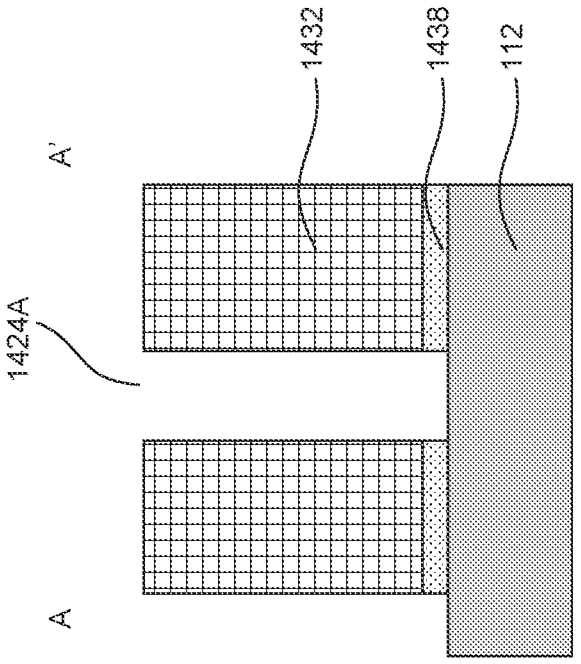
FIG. 20A
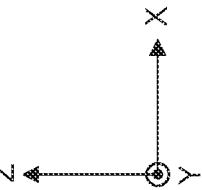

UNIFORM TRENCHES IN SEMICONDUCTOR DEVICES AND MANUFACTURING METHOD THEREOF

CROSS-REFERENCE TO RELATED APPLICATION

This application claims the benefit of U.S. Provisional Patent Application No. 63/301,265, titled "Semiconductor Device and Manufacturing Process Thereof," which was filed on Jan. 20, 2022 and is incorporated herein by reference in its entirety.

BACKGROUND

Semiconductor image sensor devices are used to sense incoming visible or non-visible radiation, such as visible light and infrared light. These image sensors utilize an array of pixels, which can include photodiodes and transistors, to absorb (e.g., sense) the incident radiation and convert the sensed radiation into electrical signals. An example of a semiconductor image sensor is a complementary metal-oxide-semiconductor (CMOS) image sensor. CMOS image sensors are used in various applications, such as computers, digital cameras, mobile phones, tablets, goggles, and scientific instruments.

BRIEF DESCRIPTION OF THE DRAWINGS

Aspects of the present disclosure are best understood from the following detailed description when read with the accompanying figures.

FIGS. 7-22B illustrate top and cross-sectional views of a semiconductor device having radiation-sensing regions separated by trench isolation structures at various stages of its fabrication process, in accordance with some embodiments.

Illustrative embodiments will now be described with reference to the accompanying drawings. In the drawings, like reference numerals generally indicate identical, functionally similar, and/or structurally similar elements.

DETAILED DESCRIPTION

Figure 1:
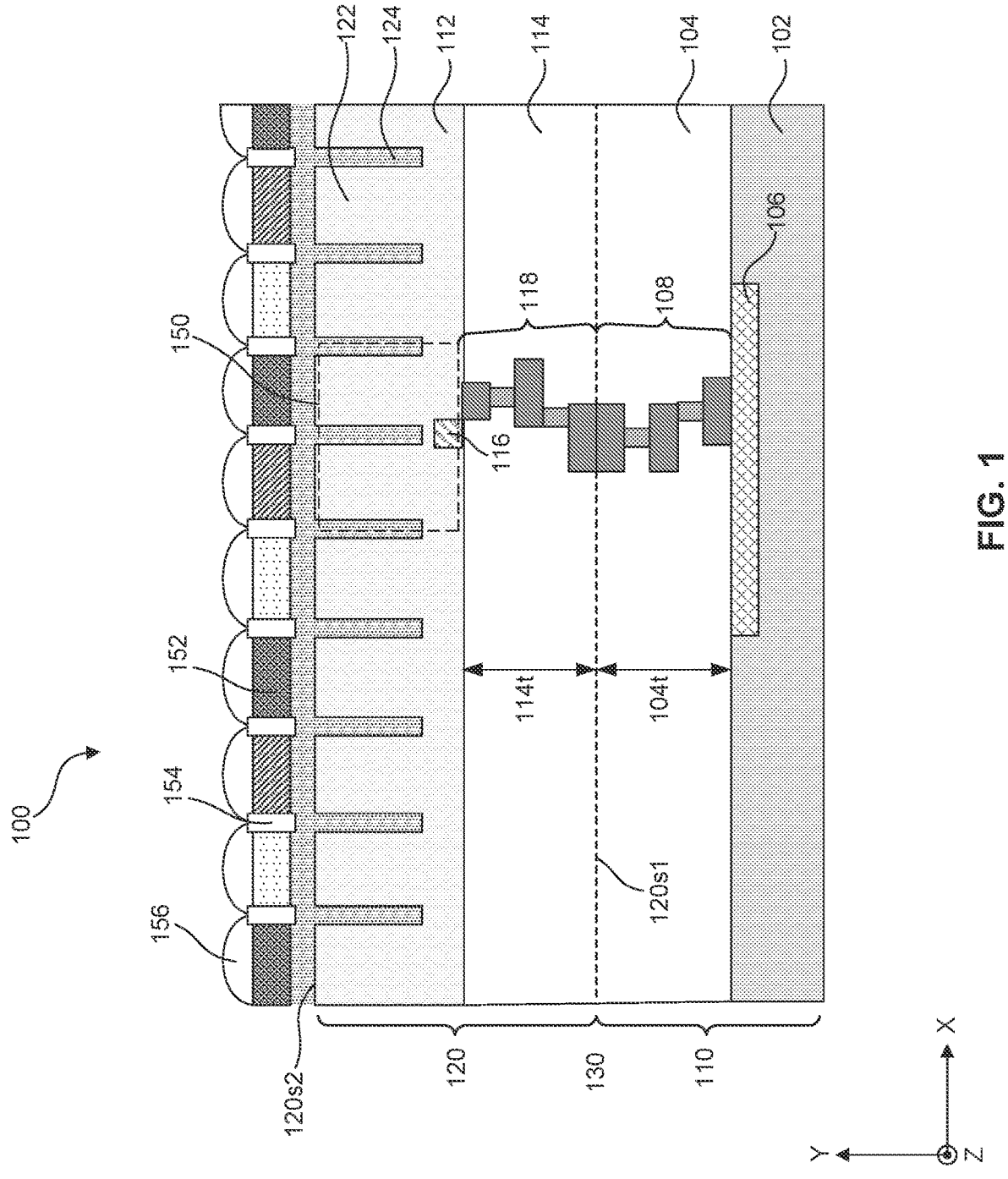
FIG. 1 illustrates a cross-sectional view of a semiconductor device having radiation-sensing regions separated by trench isolation structures, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over a second feature in the description that follows may include embodiments in which the first and second features are formed in direct contact, and may also include embodiments in which additional features may be formed between the first and second features, such that the first and second features may not be in direct contact. As used herein, the formation of a first feature on a second feature means the first feature is formed in direct contact with the second feature. In addition, the present disclosure may repeat reference numerals and/or letters in the various examples. This repetition does not in itself dictate a relationship between the various embodiments and/or configurations discussed.

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It is noted that references in the specification to "one embodiment," "an embodiment," "an example embodiment," "exemplary," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of one skilled in the art to effect such feature, structure or characteristic in connection with other embodiments whether or not explicitly described.

It is to be understood that the phraseology or terminology herein is for the purpose of description and not of limitation, such that the terminology or phraseology of the present specification is to be interpreted by those skilled in relevant art(s) in light of the teachings herein.

In some embodiments, the terms "about" and "substantially" can indicate a value of a given quantity that varies within 5% of the value (e.g., +1%, +2%, +3%, +4%, +5% of the value). These values are merely examples and are not intended to be limiting. The terms "about" and "substantially" can refer to a percentage of the values as interpreted by those skilled in relevant art(s) in light of the teachings herein.

A CMOS image sensor includes a semiconductor substrate (e.g., a silicon substrate) with an array of pixels or radiation-sensing regions formed therein. As disclosed herein, the terms "radiation-sensing regions" and "pixels" may be used interchangeably throughout. The radiation-sensing regions (or pixels) are configured to convert photons from the incident radiation to an electrical signal. The CMOS image sensor can further include transfer transistors, diffusion wells, source followers, reset transistors, and in-pixel circuits to distribute and process the electrical signal. The electrical signal is subsequently passed to signal processing components attached to the CMOS image sensor. For this reason, the pixel array overlies a multilevel metallization layer (e.g., interconnect structures) configured to distribute the electrical signal generated within the radiation-sensing regions to appropriate processing components.

The multilevel metallization layer includes interconnect structures formed on a first surface of the semiconductor substrate (referred to herein as the "front side" surface of the semiconductor substrate). Further, the pixel array extends into the semiconductor substrate and is configured to receive radiation from a second surface of the semiconductor substrate opposite to the front side surface of the semiconductor substrate. This second surface of the semiconductor substrate that receives the radiation (and is opposite to the front surface of the semiconductor substrate) is referred to herein as the "back side" surface of the semiconductor substrate.

Neighboring radiation sensing regions (or pixels) in the semiconductor substrate are electrically isolated with isolation structures, such as deep trench isolation (DTI) structures, to minimize cross talk and signal loss between the radiation-sensing regions. Aligned to the aforementioned isolation structures (and formed on the back surface of the semiconductor substrate) are respective grid structures that provide optical isolation between neighboring pixels or radiation-sensing regions. Adjacent grid structures collectively form cells.

By way of example and not limitation, the substrate with the radiation-sensing regions (or pixels), the processing components, the multilevel metallization layer, and the grid structure formed thereon can be attached via wafer bonding structures to an application specific integrated circuit (ASIC) formed on a different substrate. The ASIC can be, for example, a CMOS wafer-fabricated separately from the CMOS image sensor device-configured to perform the signal processing operations discussed above.

A challenge with the CMOS image sensor is non-uniform depth of the trench isolation structures. Trench isolation structures can horizontally and vertically isolate radiation sensing regions. The trench isolation structures can intersect at a cross-road portion. The cross-road portion of the trench isolation structures can have a greater width than the horizontal and vertical straight portions. During the etching process to form the trenches, trenches having a greater width can have a greater depth due to the loading effect of the plasma etching process. The transfer transistors of the CMOS image sensor can be located under the trench isolation structures. As a result, a deeper trench at the cross-road portion can damage at least a portion of the transfer transistors, thus reducing device performance of the CMOS image sensor.

Various embodiments of the present disclosure provide example semiconductor devices having radiation-sensing regions separated by trench isolation structures (e.g., separated by substantially uniform trench isolation structures) and example methods to fabricate the same. According to some embodiments, the semiconductor devices can include an ASIC chip bonded to a first side (e.g., front side) of an image sensor chip. The image sensor chip can have CMOS image sensors on its second side (e.g., back side). The radiation-sensing regions of the CMOS images sensors can be isolated by the trench isolation structures. The trench isolation structures can have straight portions between adjacent radiation-sensing regions and cross-road portions where the straight portions intersect. The cross-road portions can have a width greater than a width of the straight portions. In some embodiments, the cross-road trenches between radiation-sensing regions can be formed with an extra pattern at the cross-road portion. As a result, the cross-road portions can have a depth substantially the same as a depth of the straight portions. In some embodiments, the straight portions of the trench isolation structures can have a convex bottom surface and the cross-road portions can have a concave bottom surface. In some embodiments, a difference of the depth of the cross-road portion and the depth of the straight portions can range from about 1 Å to about 8000 Å. A ratio of the difference to the depth of the straight portions can be less than about 20%. In some embodiments, with the extra pattern at the cross-road portion, the depth uniformity of the trench isolation structures at straight and cross-road portions can be improved by about 20% to about 40%, and the device performance of the CMOS image sensor can be improved by about 5% to about 10%.

FIG. 1 illustrates a cross-sectional view of a semiconductor device 100 having radiation-sensing regions 122 separated by trench isolation structures 124, in accordance with some embodiments. Trench isolation structures 124 can be substantially uniform trench isolation structures, in accordance with some embodiments. As shown in FIG. 1, semiconductor device 100 can include first chip 110 and second chip 120 bonded at an interface 130. First chip 110 can be bonded to first side 120s1 of second chip 120. In some embodiments, first chip 110 can be an ASIC chip and can include first substrate 102, first dielectric layer 104, application-specific circuit 106, and first interconnect structure 108. In some embodiments, second chip 120 can be an image sensor chip having image sensor devices and can include second substrate 112, second dielectric layer 114, second interconnect structure 118, float device 116, radiation-sensing regions 122, and trench isolation structures 124. Radiation-sensing regions 122 and trench isolation structures 124 can be disposed on second side 120s2 opposite to first side 120s1.

First and second substrates 102 and 112 can each include a semiconductor material, such as silicon and germanium. In some embodiments, first and second substrates 102 and 112 can include a crystalline silicon substrate (e.g., wafer). In some embodiments, first and second substrates 102 and 112 can include (i) an elementary semiconductor, such as germanium; (ii) a compound semiconductor including silicon carbide, gallium arsenide, gallium phosphide, indium phosphide, indium arsenide, and/or indium antimonide; (iii) an alloy semiconductor including silicon germanium carbide, silicon germanium, gallium arsenic phosphide, gallium indium phosphide, gallium indium arsenide, gallium indium arsenic phosphide, aluminum indium arsenide, and/or aluminum gallium arsenide; or (iv) a combination thereof. In some embodiments, first and second substrates 102 and 112 can include the same semiconductor material. In some embodiments, first and second substrates 102 and 112 can include semiconductor materials different from each other. Further, first and second substrates 102 and 112 can be doped depending on design requirements (e.g., p-type substrate or n-type substrate). In some embodiments, first and second substrates 102 and 112 can include silicon and can be doped with p-type dopants (e.g., boron, indium, aluminum, or gallium) or n-type dopants (e.g., phosphorus or arsenic).

Referring to FIG. 1, first dielectric layer 104 can be disposed on first substrate 102 and second dielectric layer 114 can be disposed on second substrate 112. First and second dielectric layers 104 and 114 can be bonded at interface 130. In some embodiments, first and second dielectric layers 104 and 114 can each include a dielectric material, such as silicon oxide ($SiO_2$), silicon oxynitride (SiON), silicon nitride ($SiN_x$), silicon oxycarbide (SiOC), silicon oxynitricarbide (SiOCN), and a combination thereof. In some embodiments, first and second dielectric layers 104 and 114 can include the same dielectric material. In some embodiments, first and second dielectric layers 104 and 114 can include dielectric materials different from each other. In some embodiments, first and second dielectric layers 104 and 114 can include a stack of dielectric layers and can bond first chip 110 to second chip 120.

In some embodiments, after bonding first dielectric layer 104 to second dielectric layer 114 at interface 130, first interconnect structure 108 can be bonded to and electronically connected to second interconnect structure 118. The bond between first chip 110 and second chip 120 can include a dielectric-to-dielectric bond between first and second dielectric layers 104 and 114 and a metal-to-metal bond between first and second interconnect structures 108 and 118. The bond between first chip 110 and second chip 120 can be referred to as a "wafer bond." In some embodiments, the dielectric-to-dielectric bond can include an oxide-to-oxide bond. In some embodiments, first dielectric layer 104 can have a vertical dimension 104t (e.g., thickness) along a Z-axis ranging from about 2 μm to about 8 μm. Second dielectric layer 114 can have a vertical dimension 114t (e.g., thickness) along a Z-axis ranging from about 2 μm to about 8 μm.

Referring to FIG. 1, first interconnect structure 108 can be disposed in first dielectric layer 104 and second interconnect structure 118 can be disposed in second dielectric layer 114. In some embodiments, each of first and second interconnect structures 108 and 118 can include one or more metal lines and/or metal vias. First and second interconnect structures 108 and 118 can include aluminum (Al), tungsten (W), copper (Cu), ruthenium (Ru), molybdenum (Mo), nickle (Ni), bismuth (Bi), scandium (Sc), titanium (Ti), cobalt (Co), silver (Ag), titanium nitride (TiN), tantalum nitride (TaN), tungsten nitride (WN), titanium carbide (TiC), titanium aluminum carbide (TiAlC), tantalum aluminum carbide (TaAlC), metal alloys, and other suitable conductive materials. First and second interconnect structures 108 and 118 can connect image sensors at radiation-sensing regions 122 on second chip 120 to application-specific circuit 106 on first chip 110.

Application-specific circuit 106 can be disposed on first substrate 102 and can be connected to image sensor devices on second chip 120 through first and second interconnect structures 108 and 118 and float device 116. Application-specific circuit 106 can include an analog-to-digital converter (ADC), a counter, a memory storage device, and combinations thereof to process electrical signals generated by the image sensor devices on second chip 120.

Referring to FIG. 1, radiation-sensing regions 122 and trench isolation structures 124 can be disposed on second side 120s2 of second chip 120. In some embodiments, radiation-sensing regions 122 can include a semiconductor material, such as silicon, germanium, and silicon germanium, depending on the radiation wavelength of interest. For example, silicon can be used for visible light applications (e.g., between about 380 nm to 740 nm) and germanium can be used for infrared applications (e.g., for wavelengths between about 940 nm and about 1550 nm). Silicon germanium can be used for wavelengths between the visible light and the infrared. By way of example and not limitation, additional materials that can be used for radiation-sensing regions 122 include semiconductor materials in the III-V group, such as gallium arsenide, gallium phosphide, indium phosphide, and gallium nitride. In some embodiments, radiation-sensing regions 122 can include image sensor devices to convert sensed incident radiation into electrical signals for further processing in first chip 110.

Figure 2:
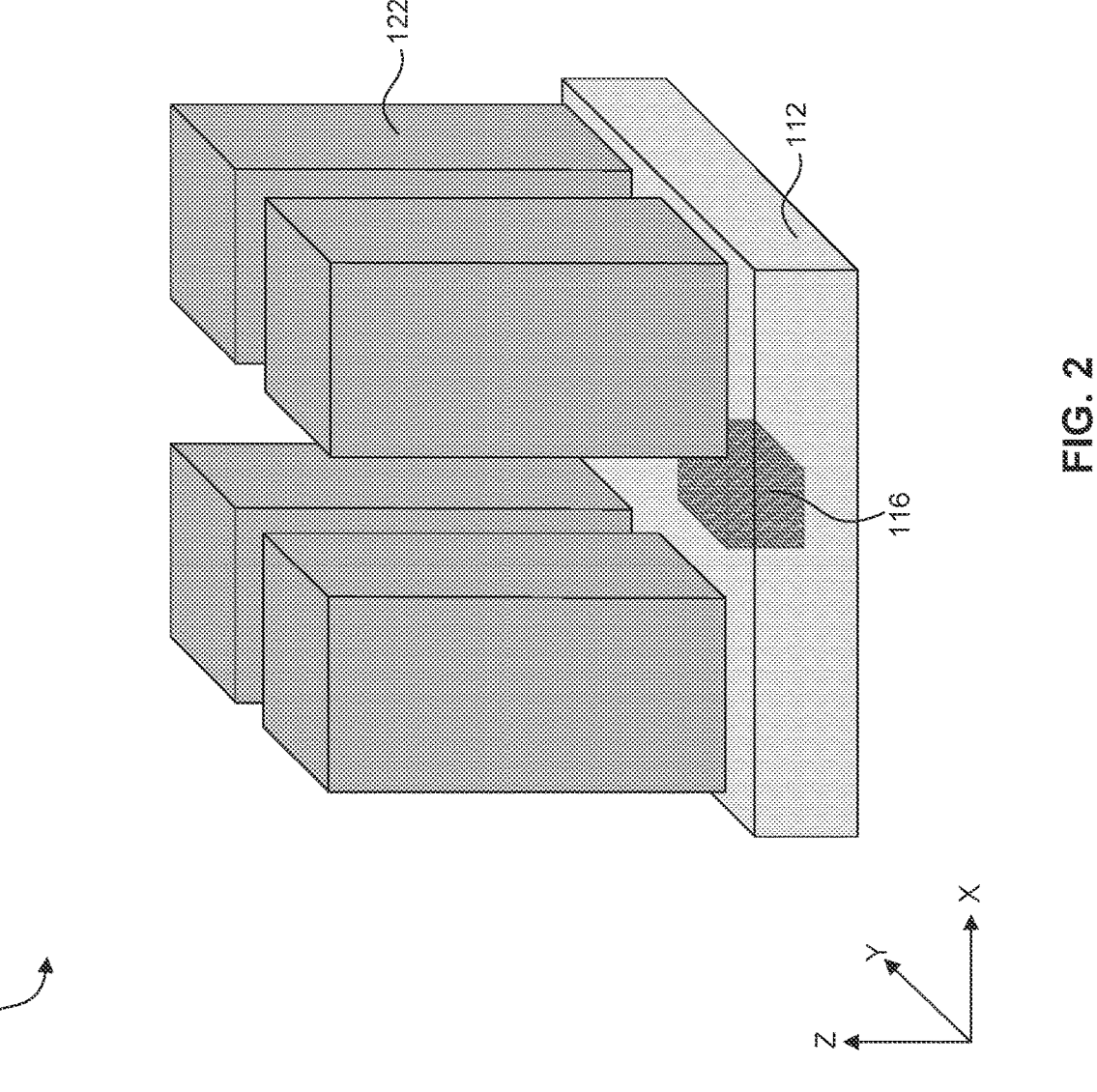
FIG. 2 illustrates a partial isometric view of a semiconductor device having radiation-sensing regions separated by trench isolation structures, in accordance with some embodiments.

In some embodiments, float device 116 can be disposed in second substrate 112 and between radiation-sensing regions 122 and second interconnect structure 118. In some embodiments, float device 116 can include transfer transistors to transfer the electrical signals generated by radiation-sensing regions 122 to second interconnect structure 118. In some embodiments, at least a portion of float device 116 can be disposed beneath trench isolation structures 124, as shown in FIGS. 1 and 2. FIG. 2 illustrates an isometric view of region 150 in semiconductor device 100 as shown in FIG. 1, in accordance with some embodiments. Trench isolation structures 124 are not shown in FIG. 2 merely for clarity and ease of description.

Figure 3:
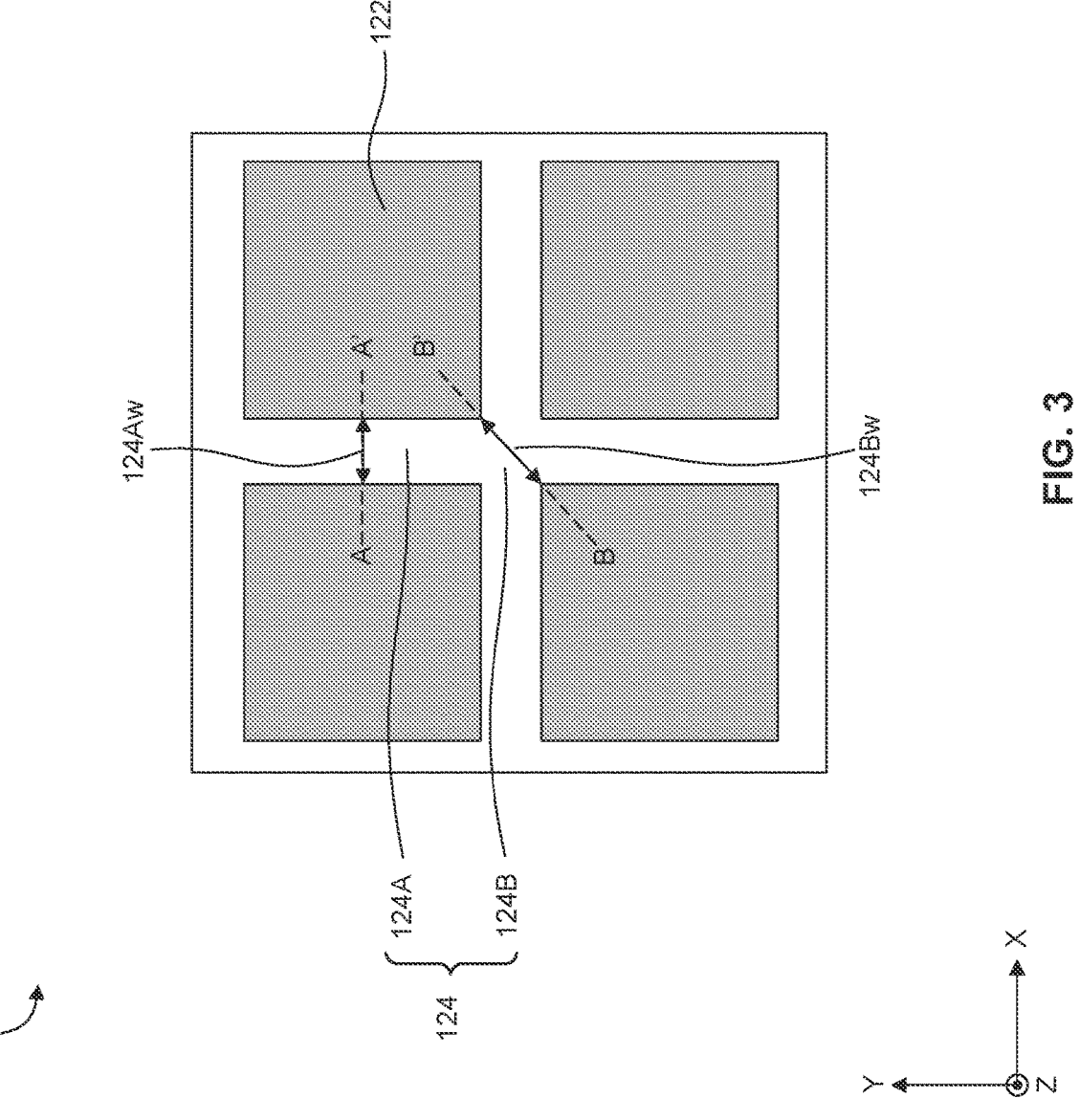
FIG. 3 illustrates a partial top view of a semiconductor device having radiation-sensing regions separated by trench isolation structures, in accordance with some embodiments.
Figure 4B:
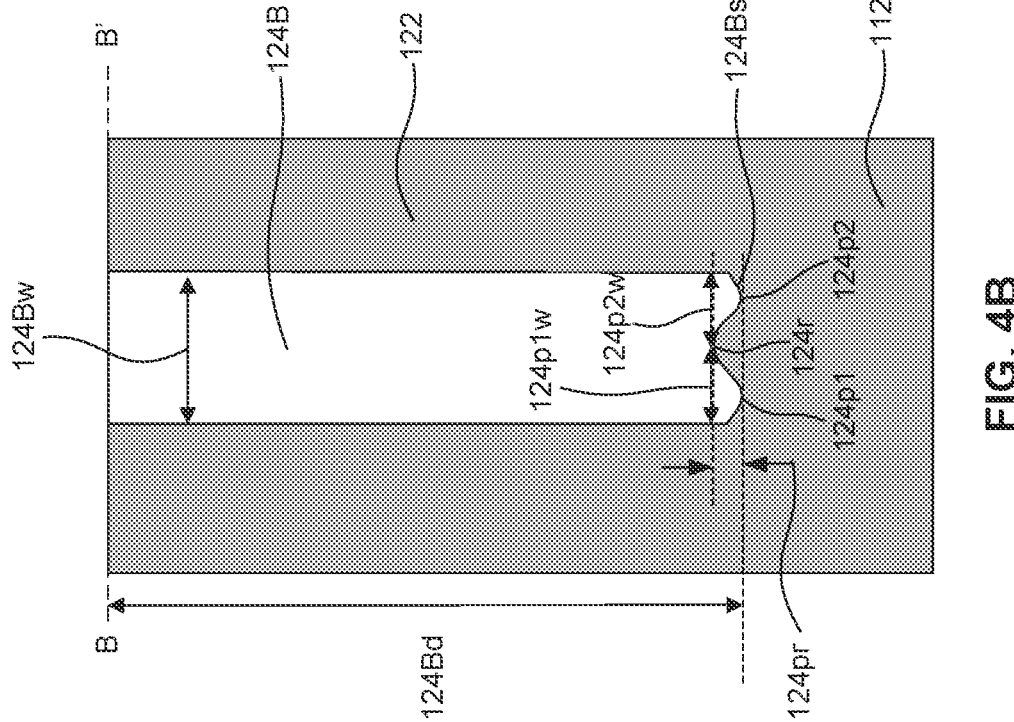
FIGS. 4A and 4B illustrate partial cross-sectional views of a semiconductor device having radiation-sensing regions separated by trench isolation structures, in accordance with some embodiments.
Figure 4A:
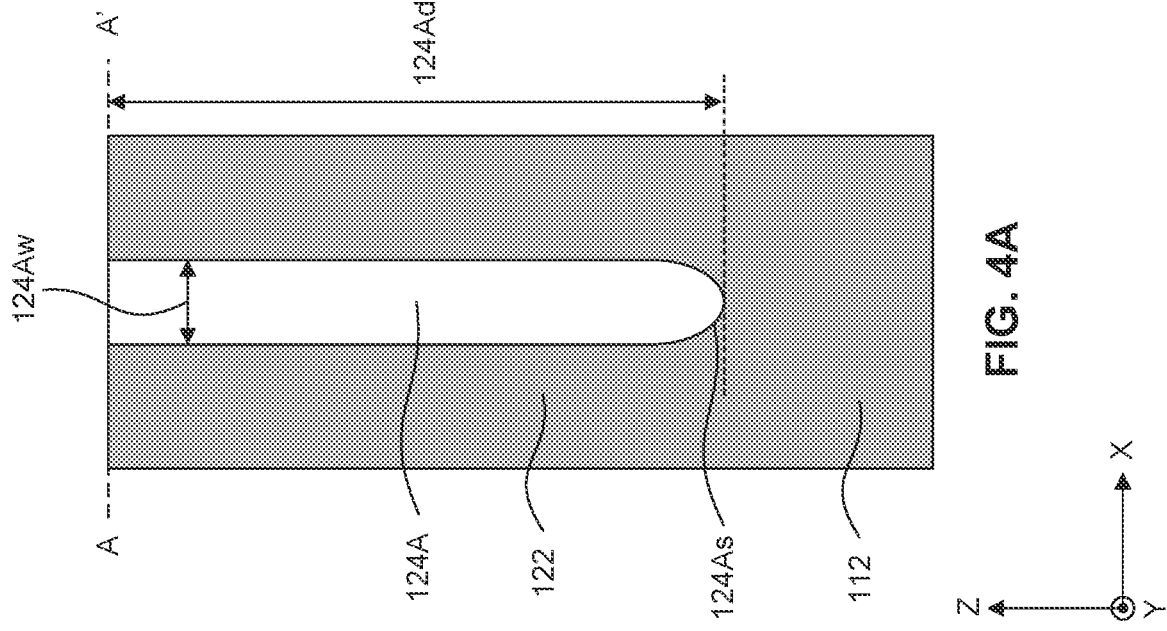

Trench isolation structures 124 can be disposed between adjacent radiation-sensing regions 122 to minimize cross talk and signal loss between the radiation-sensing regions 122. FIG. 3 illustrates a top view of region 150 in semiconductor device 100 as shown in FIGS. 1 and 2, in accordance with some embodiments. FIG. 4A illustrates a cross-sectional view of semiconductor device 100 along line A-A' as shown in FIG. 3, in accordance with some embodiments. FIG. 4B illustrates a cross-sectional view of semiconductor device 100 along line B-B' as shown in FIG. 3, in accordance with some embodiments. As shown in FIGS. 3, 4A, and 4B, trench isolation structures 124 can include straight portions 124A and cross-road portions 124B. Straight portions 124A can extend horizontally or vertically between adjacent radiation-sensing regions 122. Cross-road portions 124B can be located where horizontal and vertical straight portions of trench isolation structures 124 intersect.

As shown in FIGS. 3, 4A, and 4B, straight portions 124A of trench isolation structures 124 can have a width 124Aw along line A-A' (e.g., X-axis) ranging from about 40 nm to about 100 nm. Cross-road portions 124B of trench isolation structures 124 can have a width 124Bw along line B-B' ranging from about 80 nm to about 400 nm. In some embodiments, a ratio of width 124Bw to width 124Aw can range from about 2 to about 4 due to corner rounding of radiation-sensing regions 122 during the formation of trench isolation structures 124.

Referring to FIG. 4A, straight portions 124A of trench isolation structures 124 can have a depth 124Ad along a Z-axis ranging from about 2 μm to about 4 μm. In some embodiments, a ratio of depth 124Ad to width 124Aw for straight portions 124A can range from about 20 to about 100. The ratio of depth 124Ad to width 124Aw can be referred to as aspect ratio of straight portions 124A of trench isolation structures 124. Referring to FIG. 4B, cross-road portions 124B of trench isolation structures 124 can have a depth 124Bd along a Z-axis ranging from about 2 μm to about 4 μm. In some embodiments, a ratio of depth 124Bd to width 124Bw for cross-road portions 124B can range from about 5 to about 50. The ratio of depth 124Bd to width 124Bw can be referred to as aspect ratio of cross-road portions 124B of trench isolation structures 124. In some embodiments, due to the high aspect ratios of trench isolation structures 124, trench isolation structures 124 can also be referred to as deep trench isolation (DTI) structures. In some embodiments, trench isolation structures 124 can be formed by filling trenches with an isolation material, such as silicon oxide and a high-k dielectric material. The term "high-k" can refer to a high dielectric constant. In the field of semiconductor device structures and manufacturing processes, high-k can refer to a dielectric constant that is greater than the dielectric constant of SiO₂ (e.g., greater than about 3.9). The high-k dielectric material can include hafnium oxide (HfO₂), zirconium oxide (ZrO₂), and other suitable high-k dielectric materials. In some embodiments, the isolation material can fill the trenches and can be deposited on second side 120s2 of second chip 120. Accordingly, trench isolation structures 124 can also be referred to as trench fill structures.

In some embodiments, a difference between depth 124Ad and 124Bd can be less than about 8000 Å. A ratio of the difference to depth 124Ad—i.e., ratio of [depth 124Bd—depth 124Ad] to [depth 124Ad]—(referred to as depth difference ratio) can be less than about 20%. If the difference is greater than about 8000 Å, or the ratio is greater than about 20%, cross-road portions 124B of trench isolation structures 124 may have a greater depth and float device 116 beneath trench isolation structures 124 may be damaged. With less depth difference between straight portions 124A and cross-road portions 124B of trench isolation structures 124, semiconductor device 100 can have trench isolation structures 124 with substantially uniform depth. As a result, the damage to float device 116 beneath cross-road portions 124B can be reduced and device performance of semiconductor device 100 can be improved. In some embodiments, with the depth difference ratio of trench isolation structures 124 less than about 20%, the depth uniformity of trench isolation structures 124 can be improved by about 20% to about 40%. With the improvement of depth uniformity, the device performance of semiconductor device 100 can be improved by about 5% to about 10%, in accordance with some embodiments.

Referring to FIGS. 4A and 4B, straight portions 124A of trench isolation structures 124 can have a convex bottom surface 124As and cross-road portions 124B can have a concave bottom surface 124Bs. As shown in FIG. 4B, concave bottom surface 124Bs of cross-road portions 124B can include a first protrusion 124p1, a second protrusion 124p2, and a recess 124r. In some embodiments, first protrusion 124p1 can have a width 124p1w along line B-B' ranging from about 40 nm to about 200 nm. Second protrusion 124p2 can have a width 124p2w along line B-B' ranging from about 40 nm to about 200 nm. In some embodiments, a ratio of a difference between width 124p1w and width 124p2w to width 124Bw—i.e., ratio of [width 124p1w—width 124p2w] to [width 124Bw]—can be less than about 20%. If the ratio of the difference to width 124Bw is greater than about 20%, cross-road portions 124B of trench isolation structures 124 may have a greater depth and float device 116 beneath trench isolation structures 124 may be damaged.

In some embodiments, a distance 124pr along a Z-axis between recess 124r and protrusions 124p1 and 124p2 can range from about 10 Å to about 2000 Å. A ratio of distance 124pr to depth 124Ad can range from about 0.02% to about 5%. If the distance is greater than about 2000 Å, or the ratio is greater than about 5%, cross-road portions 124B of trench isolation structures 124 may have a greater depth and float device 116 beneath trench isolation structures 124 may be damaged. If the distance is less than about 10 Å, or the ratio is less than about 0.02%, the manufacturing cost to form trench isolation structures 124 may increase.

Figure 5A:
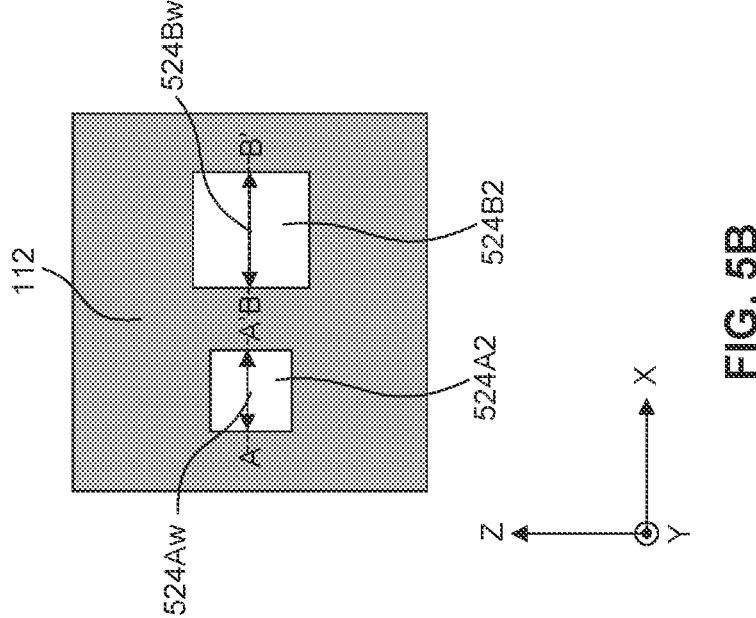
FIGS. 5A and 5B illustrate partial top views of additional trench fill structures in a semiconductor device, in accordance with some embodiments.
Figure 5B:
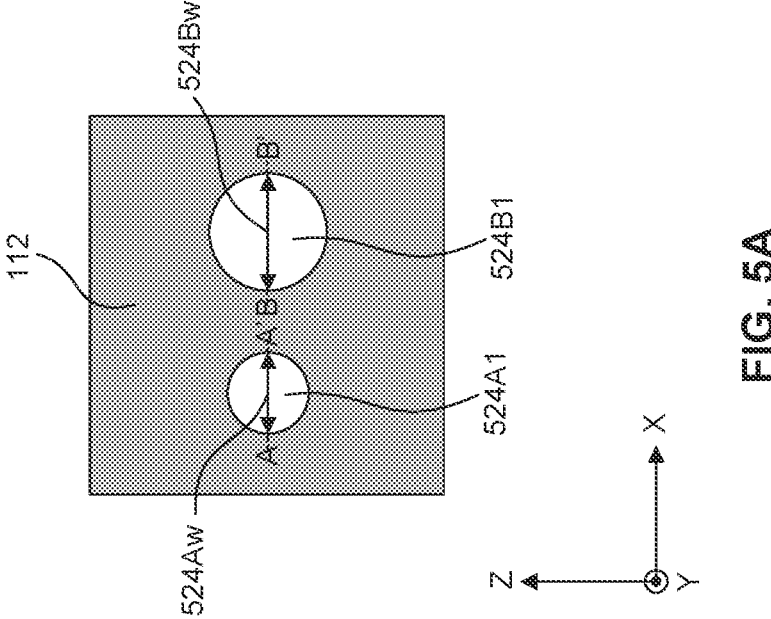

FIGS. 5A and 5B illustrate partial top views of additional trench fill structures in semiconductor device 100, in accordance with some embodiments. In some embodiments, as shown in FIGS. 5A and 5B, semiconductor device 100 can include trench fill structures 524A1 and 524B1 and trench fill structures 524A2 and 524B2. Trench fill structures 524A1 and 524A2 can have a width 524Aw along line A-A'. Trench fill structures 524B1 and 524B2 can have a width 524Bw along line B-B'. A ratio of width 524Bw to width 524Aw can range from about 2 to about 100. The depth difference ratios between trench fill structures 524A1 and 524B1 and between trench fill structures 524A2 and 524B2 can be less than about 20%. As a result, trench fill structures 524A1, 524B1, 524A2, and 524B2 can have substantially uniform depths. With substantially uniform depth of trench fill structures 524A1, 524B1, 524A2, and 524B2, the device performance of semiconductor device 100 can be improved by about 5% to about 10%, in accordance with some embodiments.

In some embodiments, semiconductor device 100 can further include color filters 152, metal grids 154, and micro-lens 156, as shown in FIG. 1. Color filters 152 can be disposed on second side 120s2 of second chip 120 and over radiation-sensing regions 122. In some embodiments, color filters 152 can include red, green, and blue filters. Metal grids 154 can be disposed on second side 120s2 of second chip 120 and over trench isolation structures 124. Color filters 152 can be disposed between sidewalls of metal grids 154. Micro-lens 156 can be disposed on second side 120s2 of second chip 120 and over color filters 152, and thus over radiation-sensing regions 122. Incident radiation can enter radiation-sensing regions 122 through micro-lens 156, color filters 152, and the isolation material on second side 120s2 of second chip 120.

Figure 6:
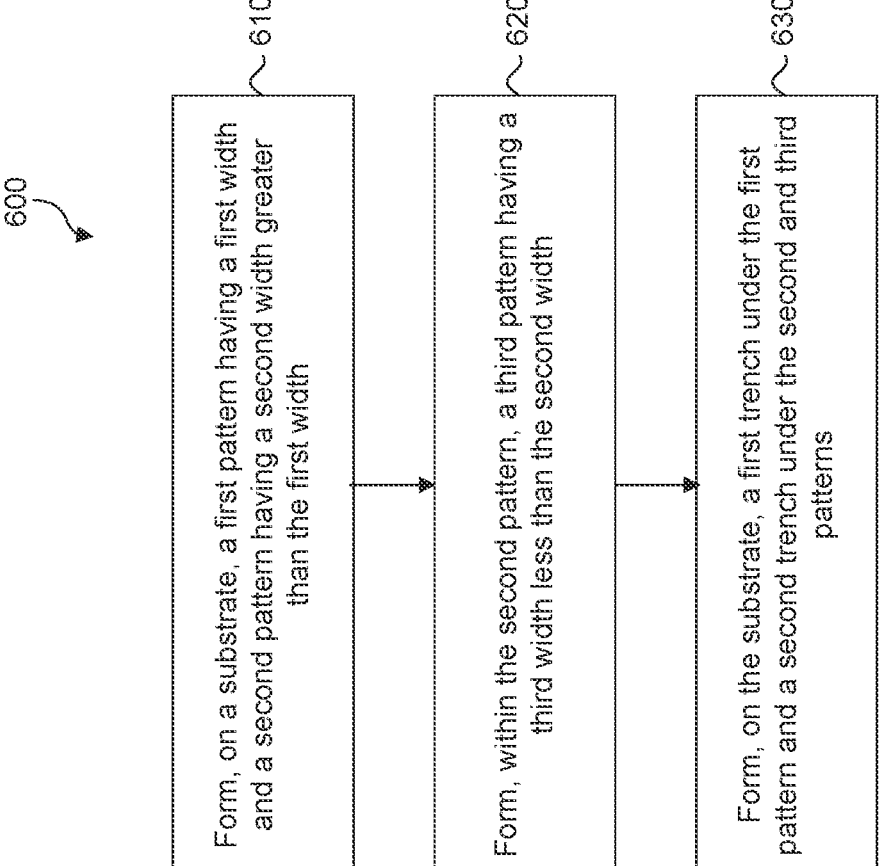
FIG. 6 is a flow diagram of a method for forming a semiconductor device having radiation-sensing regions separated by trench isolation structures, in accordance with some embodiments.

FIG. 6 is a flow diagram of an example method 600 for forming semiconductor device 100 having radiation-sensing regions separated by trench isolation structures, according to some embodiments. In some embodiments, the trench isolation structures can be substantially uniform to one another. Method 600 may not be limited to the formation of trench isolation structures in semiconductor device 100. Method 600 can be applicable to formation of trench fill structures in other suitable semiconductor devices, such as three-dimensional (3D) deep trench capacitors (DTC), 3D metal-insulator-metal (MIM) capacitors, and shallow trench isolation and silicon trench in CMOS devices. Additional processes may be performed between various operations of method 600 and may be omitted merely for clarity and ease of description. Additional processes can be provided before, during, and/or after method 600; one or more of these additional processes are briefly described herein. Moreover, not all operations may be needed to perform the disclosure provided herein. Additionally, some of the operations may be performed simultaneously or in a different order than shown in FIG. 6. In some embodiments, one or more other operations may be performed in addition to or in place of the presently described operations.

For illustrative purposes, the operations illustrated in FIG. 6 will be described with reference to the example fabrication process for forming semiconductor device 100 as illustrated in FIGS. 7-22B. FIGS. 7-22B illustrate top and cross-sectional views of semiconductor device 100 having radiation-sensing regions 122 separated by trench isolation structures 124 (e.g., substantially uniform trench isolation structures) at various stages of its fabrication process, in accordance with some embodiments. Elements in FIGS. 7-22B with the same annotations as elements in FIG. 1-4B are described above.

Figure 7:
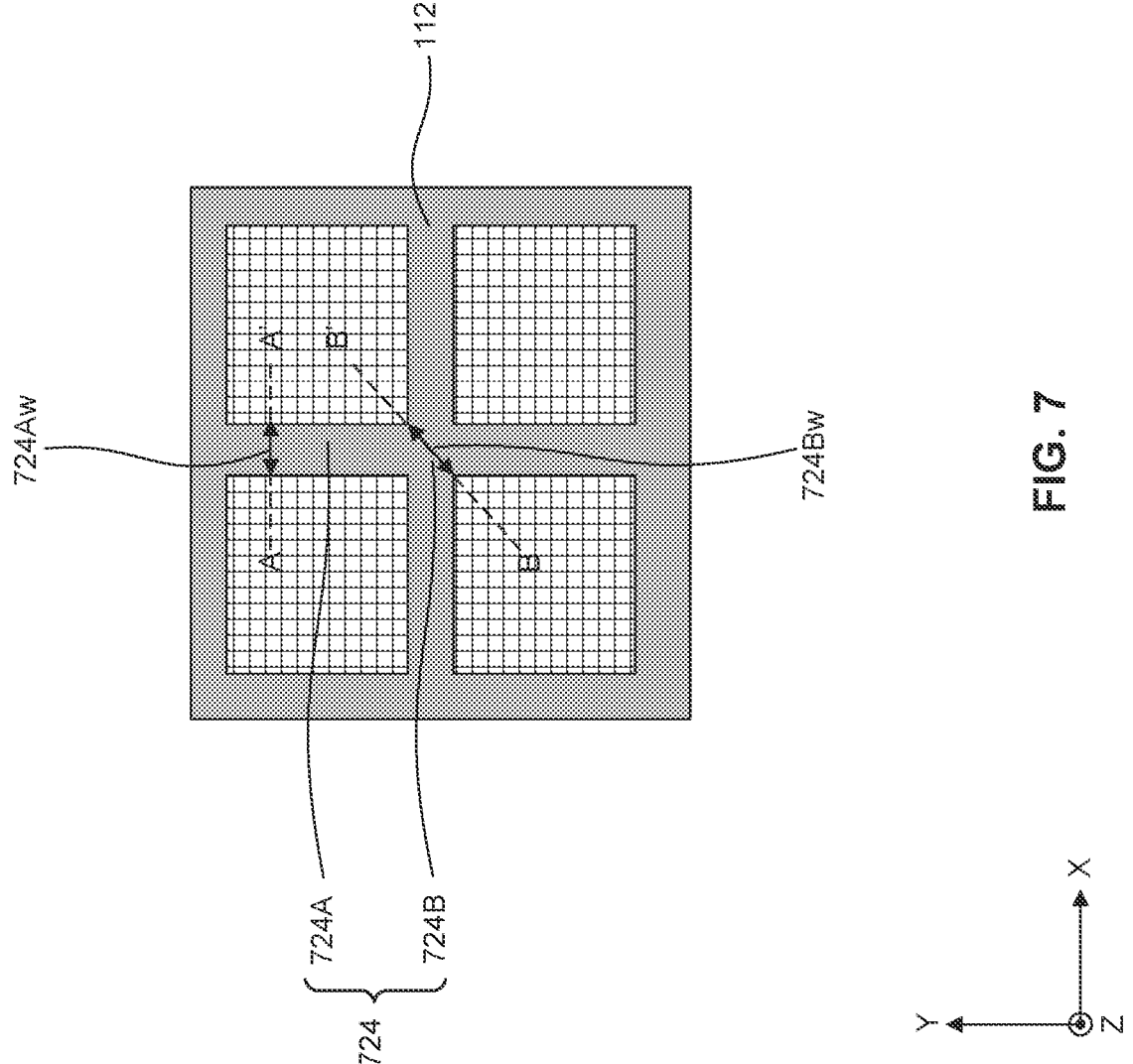
Figure 9A:
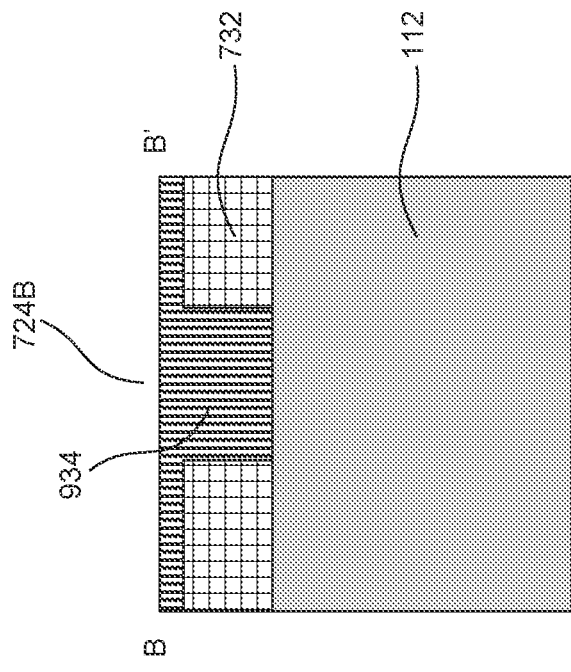
Figure 9B:
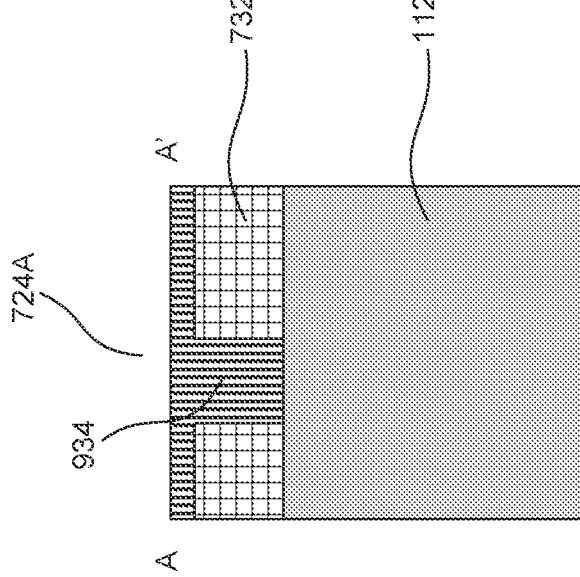

In referring to FIG. 6, method 600 begins with operation 610 and the process of forming, on a substrate, a first pattern having a first width and a second pattern having a second width greater than the first width. For example, as shown in FIGS. 7, 8A and 8B, first pattern 724A and second pattern 724B can be formed on second substrate 112. In some embodiments, as shown in FIG. 7, first pattern 724A can be straight portions and second pattern 724B can be cross-road portions of a pattern 724 formed on second substrate 112.

First pattern 724A can have a first width 724Aw along line A-A' ranging from about 40 nm to about 100 nm. Second pattern 724B can have a second width 724Bw along line B-B' ranging from about 80 nm to about 400 nm. In some embodiments, second width 724Bw can be greater than first width 724Aw and a ratio of second width 724Bw to first width 724Aw can range from about 2 to about 4 due to corner rounding effects during the formation of first and second patterns 724A and 724B.

The formation of first and second patterns 724A and 724B can include forming a mask layer 732 on second substrate 112 and patterning mask layer 732. Mask layer 732 can be blanket deposited on second substrate 112 by chemical vapor deposition (CVD), physical vapor deposition (PVD), and/or other suitable deposition methods. Composition of the mask layer 732 can include $SiO_x$, $SiN_x$, SiON, and/or other suitable materials. The patterning process can include depositing a photoresist on mask layer 732, exposing the photoresist to a pattern, performing post-exposure bake processes, and developing the photoresist to form a masking element including the photoresist. The masking element can be used to protect covered regions of hard mask layer 732 while one or more etching processes sequentially remove exposed regions of mask layer 732. In some embodiments, mask layer 732 can have a thickness 732t along a Z-axis ranging from about 10 nm to about 1000 nm.

Referring to FIG. 6, in operation 620, a third pattern can be formed within the second pattern. The third pattern has a third width less than the second width. For example, as show in FIGS. 9A-12, third pattern 1136 can be formed within second pattern 724B. Third pattern 1136 can have a width 1136w less than second width 724Bw. In some embodiments, the formation of third pattern 1136 can include depositing a coating layer 934 on first and second patterns 724A and 724B, forming a mask structure 1036 on coating layer 934 and above second pattern 724B, and etching mask structure 1036 and coating layer 934.

In some embodiments, coating layer 934 can be blanket deposited on mask layer 732 to cover first and second patterns 724A and 724B. In some embodiments, coating layer 934 can include a carbon-based dielectric material blanket deposited by CVD, PVD, atomic layer deposition (ALD), and/or other deposition methods. In some embodiments, coating layer 934 can be a bottom anti-reflection coating (BARC) layer including carbon-based dielectric material. Coating layer 934 can fill openings of first and second patterns 724A and 724B.

The deposition of coating layer 934 can be followed by the formation of mask structure 1036 above second pattern 724, as shown in FIG. 10B. In some embodiments, mask structure 1036 can be formed by a patterning process. The patterning process can include depositing a photoresist on coating layer 934, exposing the photoresist to a pattern, performing post-exposure bake processes, and developing the photoresist to form mask structure 1036. In some embodiments, mask structure 1036 can include a carbon-based or silicon-based photoresist. In some embodiments, mask structure 1036 can include one or more layers of dielectric material.

In some embodiments, as shown in FIG. 10B, mask structure 1036 can have a width 1036w along line B-B' ranging from about 40 nm to about 600 nm. Width 1036w can be greater or less than second width 724Bw, depending on subsequent etching processes. Width 1036w of mask structure 1036 can be reduced after a sequence of etching processes. In some embodiments, a ratio of width 1036w to second width 724Bw can range from about 50% to about 150%. If the ratio is less than about 50%, first and second patterns 724A and 724B may not form trenches with substantially uniform depth after subsequent etching processes. If the ratio is greater than about 150%, second pattern 724B may be blocked by mask structure 1036 and may not form trenches in second substrate 112.

Figure 12:
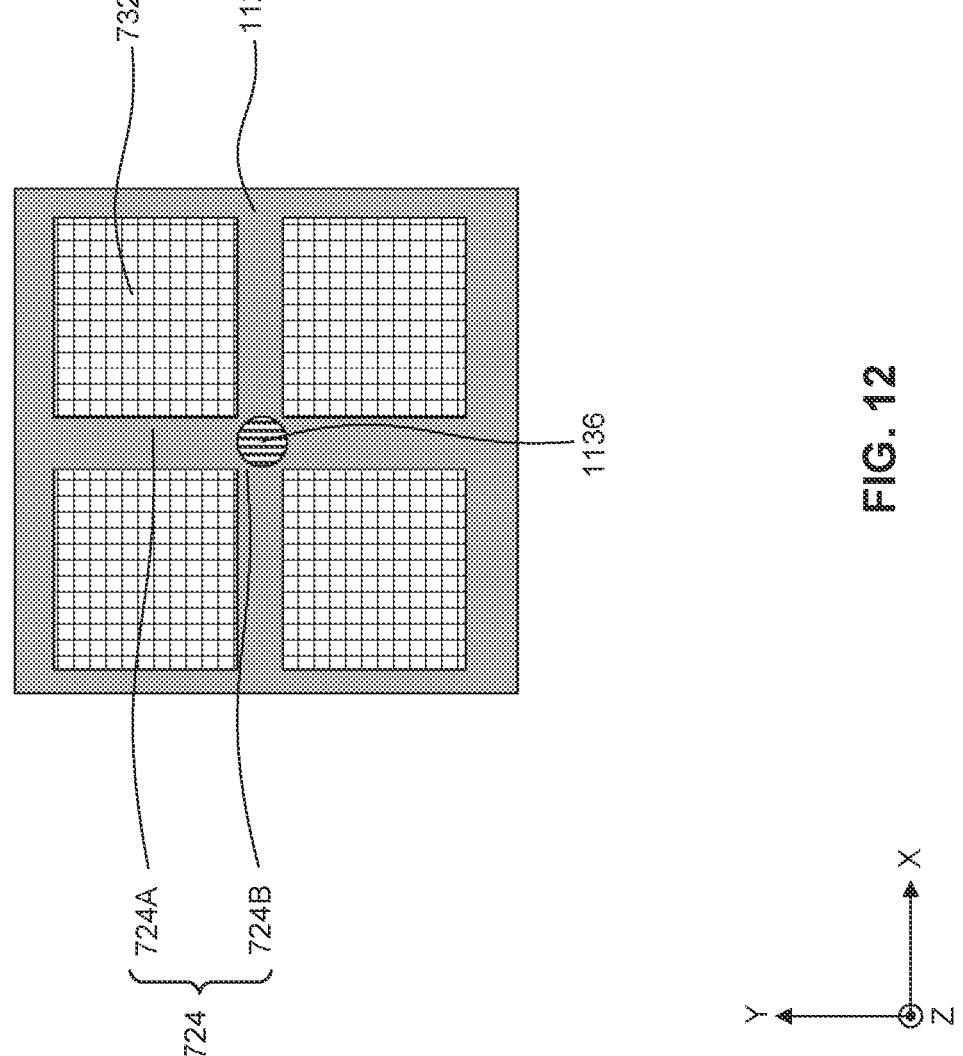

The formation of mask structure 1036 can be followed by etching mask structure 1036 and coating layer 934 to form third pattern 1136, as shown in FIGS. 11A, 11B, and 12. In some embodiments, mask structure 1036 and coating layer 934 can be etched by a dry etching process. In some embodiments, the dry etching process can be a directional etching process performed under a pressure from about 10 mTorr to about 100 mTorr at a temperature from about 0° C. to about 60° C. The dry etching process can use etchants including oxygen plasma and argon plasma. After the dry etching process, coating layer 934 in first pattern 724A can be removed and part of coating layer 934 within second pattern 724B can remain and form third pattern 1136. In some embodiments, third pattern 1136 can have width 1136w along line B-B'. Width 1136w can be less than width 724Bw. In some embodiments, width 1136w can range from about 60 nm to about 300 nm.

Referring to FIG. 6, in operation 630, a first trench is formed under the first pattern and a second trench is formed under the second and third patterns. For example, as show in FIGS. 13A and 13B, first trench 1324A can be formed under first pattern 724A and second trench 1324B can be formed under second and third patterns 724B and 1136. In some embodiments, the first and second trenches 1324A and 1324B can be formed by a plasma etching process. In some embodiments, the plasma etching process can etch semiconductor materials with etchants including chlorine ($Cl_2$) or hydrogen bromide (HBr). In some embodiments, the etchants can include fluorine-based plasma, such as sulfur hexafluoride ($SF_6$), nitrogen trifluoride ($NF_3$), and carbon tetrafluoride ($CF_4$). In some embodiments, the plasma etching process can include a bosch etching process using etchants $SF_6$ during an etch cycle and perfluoroisobutylene ($C_4F_8$) during a deposition cycle. In some embodiments, the plasma etching process can etch dielectric materials, such as $SiO_x$ with etchants including $CF_4$, difluoromethane ($CH_2F_2$), trifluoromethane ($CHF_3$), $C_4F_8$, octafluorocyclopentene ($C_5F_8$), hexafluoropropene ($C_3F_6$), argon, oxygen, and a combination thereof. In some embodiments, the plasma etching process can be performed under a pressure from about 10 mTorr to about 100 m Torr at a temperature from about 0° C. to about 60° C. In some embodiments, the plasma etching process can be performed for about 20 min to about 60 min to form first and second trenches 1324A and 1324B.

Figures 13A, 13B:
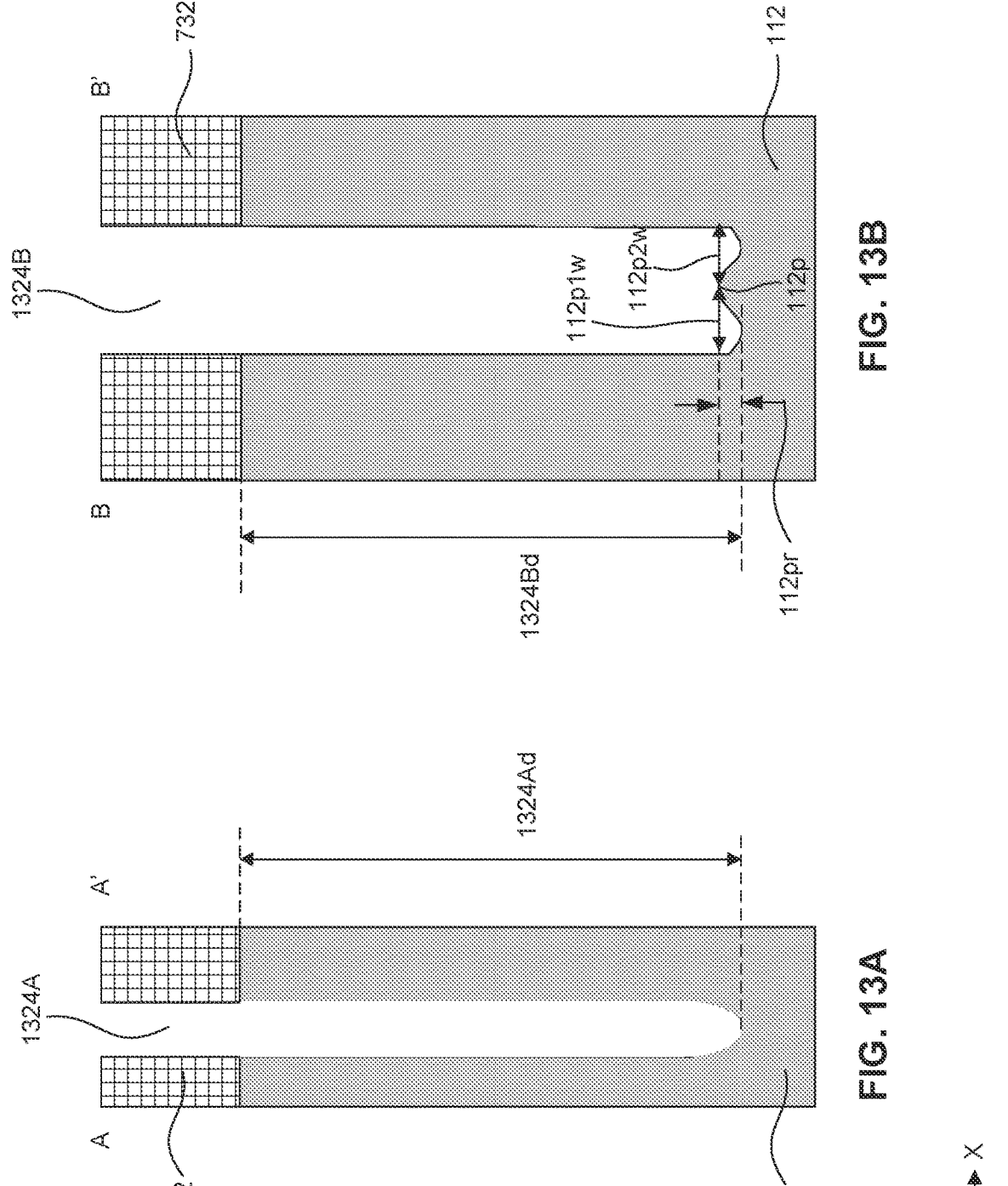

In some embodiments, first trench 1324A in second substrate 112 can have a depth 1324Ad along a Z-axis ranging from about 2 μm to about 4 μm. Depth 1324Ad can be substantially the same as depth 124Ad, as shown in FIG. 4A. Second trench 1324B in second substrate 112 can have a depth 1324Bd along a Z-axis ranging from about 2 μm to about 4 μm. Depth 1324Bd can be substantially the same as depth 124Bd, as shown in FIG. 4B. In some embodiments, first trench 1324A and second trench 1324B can have substantially the same depth. A difference between depth 1324Ad and depth 1324Bd can be less than about 8000 Å. A ratio of the difference to depth 1324Ad—i.e., ratio of [depth 1324Ad—depth 1324Bd] to [depth 1324Ad]—(also referred to as depth difference ratio) can be less than about 20%. In some embodiments, a protrusion 112p can be formed on second substrate 112 at a bottom surface of second trench 1324B after the plasma etching process. As shown in FIG. 13B, a distance 112pr between a top surface of protrusion 112p and a bottom surface of trench 1324B can range from about 10 Å to about 2000 Å, similar to distance 124pr shown in FIG. 4B. A ratio of distance 112pr to depth 1324Ad can range from about 0.02% to about 5%. In some embodiments, distances 112p1w and 112p2w along line B-B' between protrusion 112p and adjacent sidewalls of second trench 1324B can range from about 40 nm to about 200 nm. A ratio of a difference between width 112p1w and width 112p2w to width 1324Bw—i.e., ratio of [width 112p1w— width 112p2w] to [width 1324Bw]—can be less than about 20%.

With less depth difference between first trench 1324A and second trench 1324B, semiconductor device 100 can have trenches with substantially uniform depth having depth difference ratio less than about 20%. As a result, the damage to float device 116 beneath trench 1324B can be reduced and device performance of semiconductor device 100 can be improved. In some embodiments, with third pattern 1136, the depth uniformity of first and second trenches 1324A and 1324B can be improved by about 20% to about 40%. With the improvement of depth uniformity of trenches 1324A and 1324B, the device performance of semiconductor device 100 can be improved by about 5% to about 10%.

The formation of first trench 1324A and second trench 1324B can be followed by the formation of trench isolation structures 124, as shown in FIGS. 4A and 4B. The formation of trench isolation structures 124 can include filling first trench 1324A and second trench 1324B with a dielectric material, such as silicon oxide. In some embodiments, the dielectric material can be deposited using a deposition method suitable for flowable dielectric materials. For example, flowable silicon oxide can be deposited using flowable chemical vapor deposition (FCVD). After filling first trench 1324A and second trench 1324B, radiation-sensing regions 122 can be formed on second substrate 112 and between trench isolation structures 124. A chemical mechanical polishing (CMP) process can subsequently remove mask layer 732 and planarize top surfaces of trench isolation structures 124 and radiation-sensing regions 122.

Figure 14:
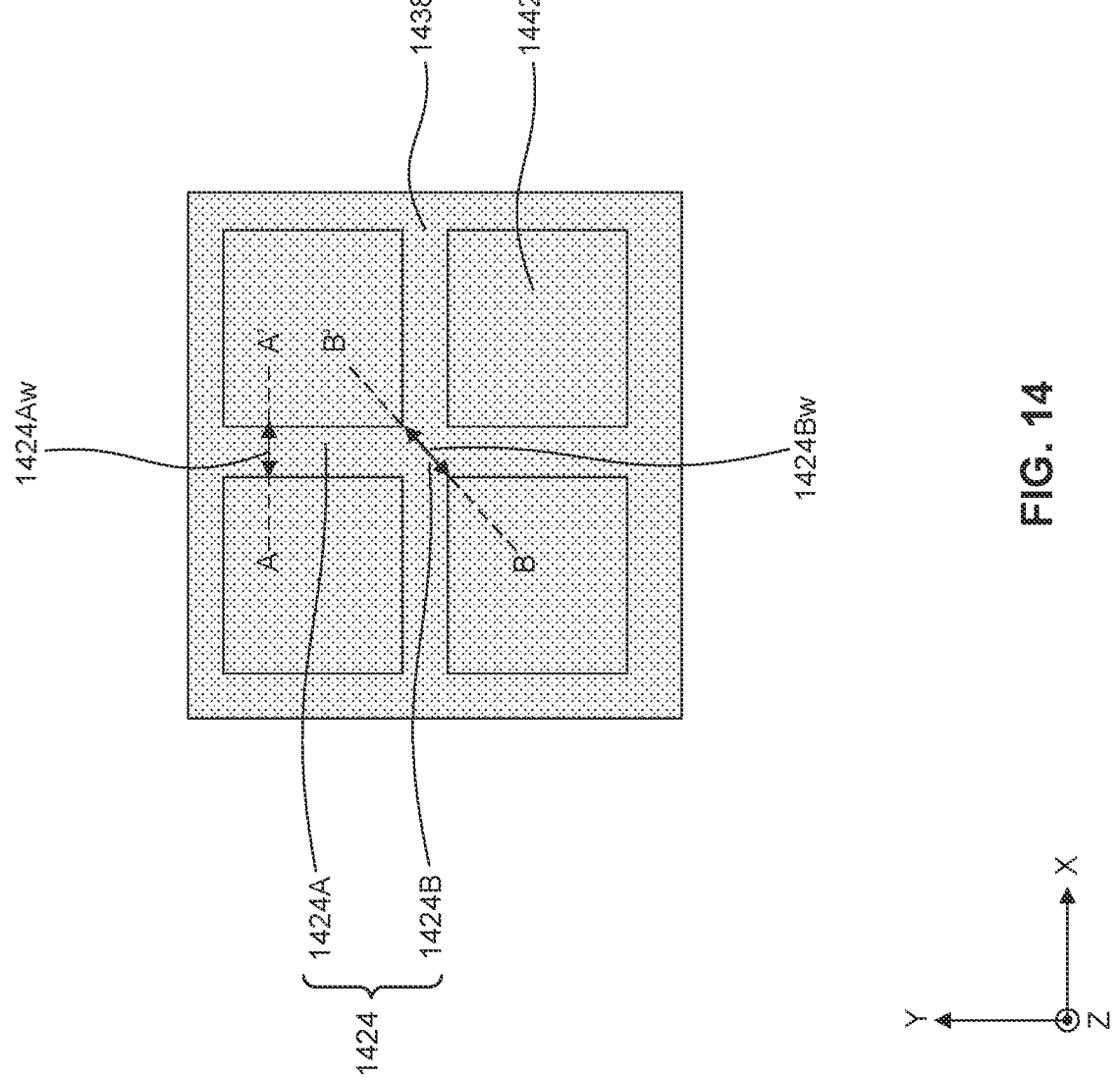

In some embodiments, a third pattern can be formed within the second pattern without the additional patterning process shown in FIGS. 10A and 10B. For examples, as shown in FIGS. 14-22B, a third pattern 2036 can be formed using a self-aligned patterning process. As shown in FIGS. 14, 15A, and 15B, first pattern 1424A and second pattern 1424B can be formed on second substrate 112. In some embodiments, as shown in FIGS. 14, 15A, and 15B, first pattern 1424A can be straight portions and second pattern 1424B can be cross-road portions of a pattern 1424 formed on second substrate 112. First pattern 1424A can have a first width 1424Aw along line A-A' ranging from about 40 nm to about 100 nm. Second pattern 1424B can have a second width 1424Bw along line B-B' ranging from about 80 nm to about 400 nm. In some embodiments, width 1424Bw can be greater than width 1424Aw and a ratio of width 1424Bw to width 1424Aw can range from about 2 to about 4 due to corner rounding effects during the formation of first and second patterns 1424A and 1424B.

The formation of first and second patterns 1424A and 1424B can include forming a first etch stop layer (ESL) 1438 on second substrate 112, forming a mask layer 1432 on first ESL 1438, forming a second ESL 1442 on mask layer 1432, and patterning second ESL 1442 and mask layer 1432. First ESL 1438, mask layer 1432 and second ESL 1442 can be blanket deposited sequentially on second substrate 112 by CVD, PVD, and/or other suitable deposition methods. Composition of mask layer 1432 can include $SiO_x$, $SiN_x$, SiON, and/or other suitable materials. Composition of first and second ESL 1438 and 1442 can include $SiN_x$, silicon carbide (SiC), silicon carbonitride (SiCN), and/or other suitable materials. In some embodiments, first and second ESL 1438 and 1442 can include the same dielectric material. In some embodiments, mask layer 1432 can include a dielectric material having an etch rate different from the dielectric material in first and second ESL 1438 and 1442. In some embodiments, first and second ESL 1438 and 1442 can include $SiN_x$ and mask layer can include $SiO_x$.

The patterning process can include depositing a photoresist on second ESL 1442, exposing the photoresist to a pattern, performing post-exposure bake processes, and developing the photoresist to form a masking element including the photoresist. The masking element can be used to protect covered regions of second ESL 1442 while one or more etching processes sequentially remove exposed regions of second ESL 1442 and mask layer 1432. In some embodiments, first ESL 1438 can have a thickness 1438t along a Z-axis ranging from about 1 nm to about 50 nm. Mask layer 1432 can have a thickness 1432t along a Z-axis ranging from about 10 nm to about 1000 nm. Second ESL 1442 can have a thickness 1442t along a Z-axis ranging from about 1 nm to about 50 nm.

The formation of first and second patterns 1424A and 1424B can be followed by depositing a dielectric layer 1644 on second ESL 1442, as shown in FIGS. 16A and 16B. In some embodiments, dielectric layer 1644 can be blanket deposited on second ESL 1442 by CVD, ALD, and/or other suitable deposition methods. After deposition of dielectric layer 1644, first pattern 1424A can be filled and second pattern 1424B can have an opening. In some embodiments, dielectric layer 1644 can have a thickness 1644t ranging from about 50 nm to about 100 nm. In some embodiments, dielectric layer 1644 can include SiOx, SiON, and/or other suitable materials.

The deposition of dielectric layer 1644 can be followed by depositing a coating layer 1746 on dielectric layer 1644, as shown in FIGS. 17A and 17B. In some embodiments, coating layer 1746 can be blanket deposited on second dielectric layer 1644 by CVD, ALD, and/or other suitable deposition methods. After deposition of coating layer 1746, second pattern 1424B can be filled. In some embodiments, coating layer 1746 can be a BARC layer including a carbon-based dielectric material.

The deposition of coating layer 1746 can be followed by forming third pattern 2036 in second pattern 1424B, as shown in FIGS. 18A-21. The formation of third pattern 2036 can include etching coating layer 1746, etching dielectric layer 1644, and etching first and second ESL 1438 and 1442. As shown in FIGS. 18A and 18B, coating layer 1746 can be etched by a plasma etching process to form first mask structure 1846 within the opening of second pattern 1424B. In some embodiments, the plasma etching process can include an etchant, such as oxygen plasma. In some embodiments, after the plasma etching process, first mask structure 1846 can have a thickness 1846t along a Z-axis ranging from about 50 nm to about 100 nm.

Figure 19A:
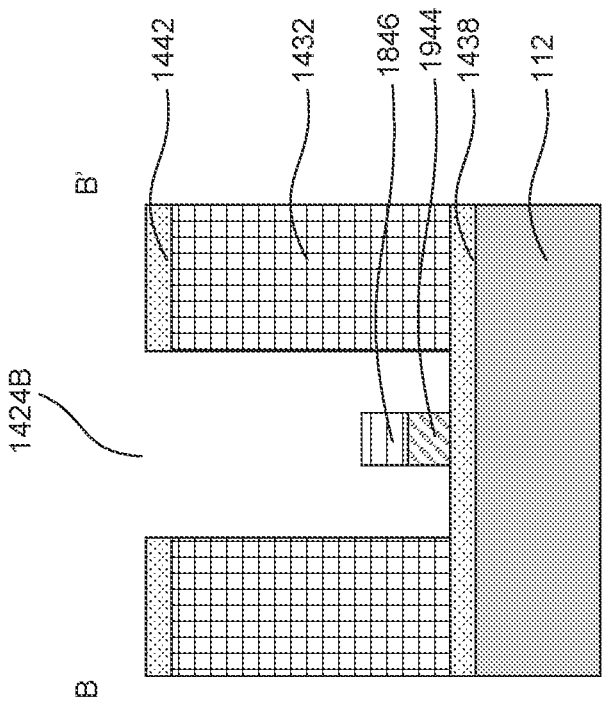
Figure 19B:
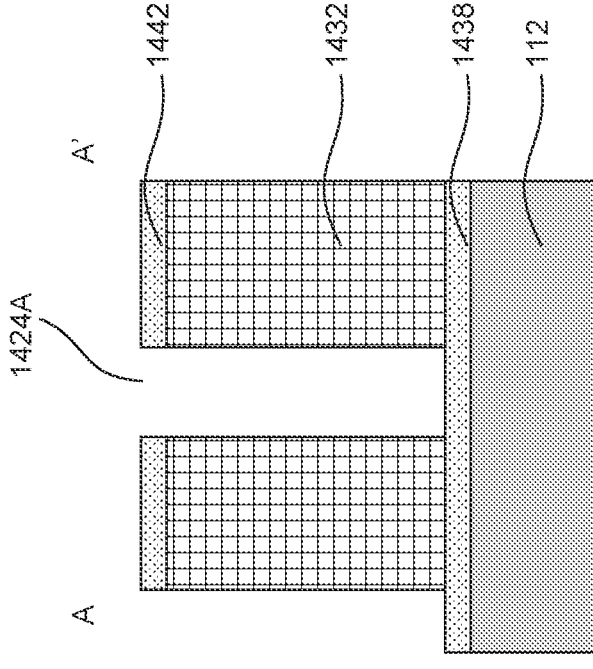
Figure 19B:
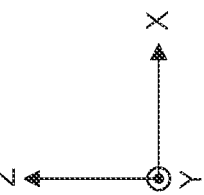

The etching of coating layer 1746 can be followed by etching dielectric layer 1644, as shown in FIGS. 19A and 19B. In some embodiments, dielectric layer 1644 can be etched by a plasma etching process. The plasma etching process can be a directional etching process and can include fluorine-based etchants, argon, oxygen, and other suitable etchants. After the plasma etching process, dielectric layer 1644 in first pattern 1424A can be removed. A portion of dielectric layer 1644 within the opening of second pattern 1424B and under first mask structure 1846 can remain and form second mask structure 1944.

Figure 21:
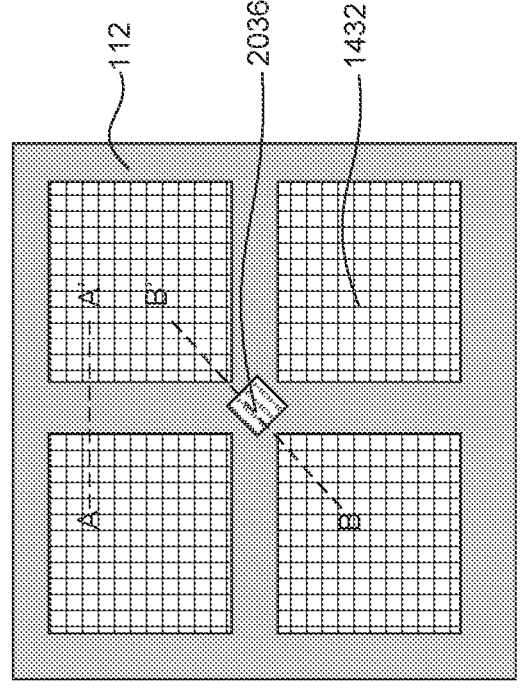
Figure 21:
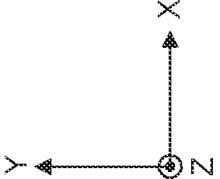

The etching of dielectric layer 1644 can be followed by etching first and second ESL 1438 and 1442, as shown in FIGS. 20A, 20B, and 21. In some embodiments, first and second ESL 1438 and 1442 can be etched by a plasma etching process. The plasma etching process can include etchants such as CF$_4$ and other suitable etchants. After the plasma etching process, second ESL 1442 and exposed first ESL 1438 can be removed. A portion of first ESL 1438 within the opening of second pattern 1424B and under second mask structure 1944 can remain and form third mask structure 2038. In some embodiments, second mask structure 1944 and third mask structure 2038 can act as third pattern 2036. As there is no additional patterning process to form third pattern 2036, the formation of third pattern 2036 can be referred to a self-aligned patterning process. In some embodiments, third pattern 2036 can have width 2036$w$ along line B-B'. Width 2036$w$ can be less than width 1424Bw. In some embodiments, width 2036$w$ can range from about 60 nm to about 300 nm.

Figure 22B:
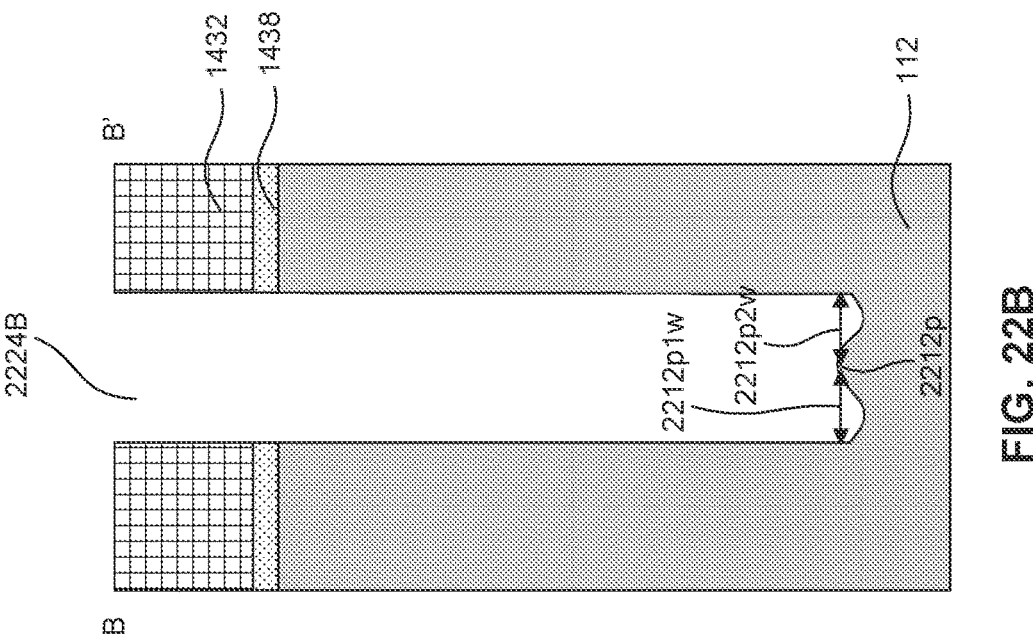
Figure 22A:
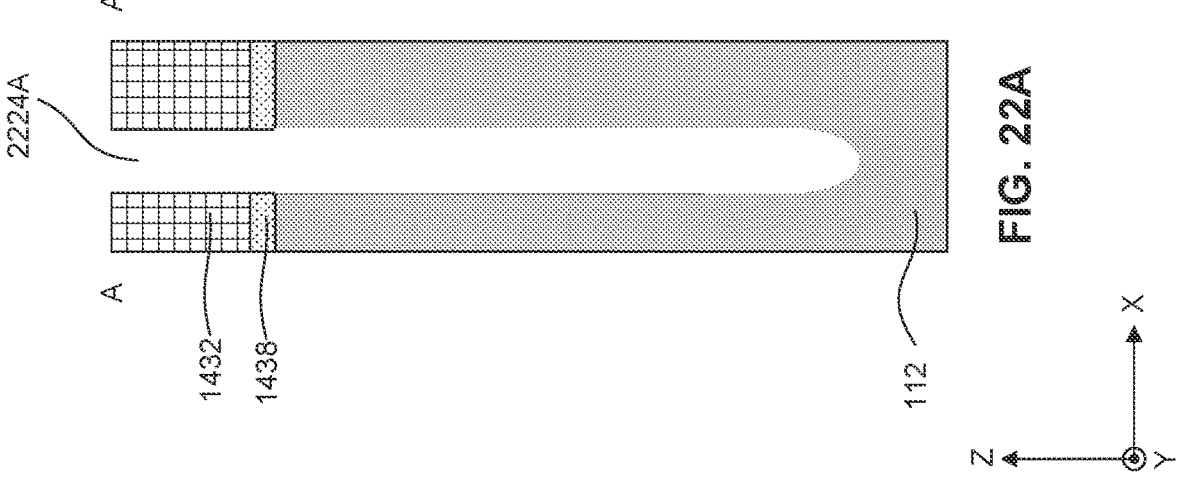

The formation of third pattern 2036 can be followed by forming first and second trenches 2224A and 2224B, as shown in FIGS. 22A and 22B. In some embodiments, first trench 2224A can be formed under first pattern 1424A and second trench 2224B can be formed under second and third patterns 1424B and 2036 by a plasma etching process. The plasma etching process can be the same as the plasma etching process to form first and second trenches 1324A and 1324B, as shown in FIGS. 13A and 13B. In some embodiments, first and second trenches 2224A and 2224B can have substantially the same depth. In some embodiments, a protrusion 2212$p$ can be formed on second substrate 112 at a bottom surface of second trench 2224B after the plasma etching process. In some embodiments, distances 2212$p1w$ and 2212$p2w$ along line B-B' between protrusion 2212$p$ and adjacent sidewalls of second trench 2224B can range from about 40 nm to about 200 nm. A ratio of a difference between width 2212$p1w$ and width 2212$p2w$ to width 2224Bw—i.e., ratio of [width 2212$p1w$-width 2212$p2w$] to [width 2224Bw] can be less than about 10%. Compared to trenches 1324A and 1324B in FIGS. 13A and 13B, trenches 2224A and 2224B formed by the self-aligned patterning process can improve depth uniformity and result in an improved symmetric protrusion 2212$p$.

The formation of first and second trenches 2224A and 2224B can be followed by formation of trench isolation structures 124, formation of radiation-sensing regions 122, and subsequent CMP processes, as shown in FIGS. 4A and 4B. Though the present disclosure describes the method for forming trench isolation structures 124—e.g., with substantially uniform depth—in semiconductor device 100, the methods can be applied to forming substantially uniform depth trenches having different widths for other semiconductor devices.

Various embodiments of the present disclosure provide example semiconductor device 100 having radiation-sensing regions 122 separated by depth trench isolation structures 124 (e.g., substantially uniform trench isolation structures). According to some embodiments, semiconductor device 100 can include first chip 110 bonded to first side 120$s1$ of second chip 120. Second chip 120 can have radiation-sensing regions 122 on its second side 120$s2$. Radiation-sensing regions 122 can be isolated by trench isolation structures 124. Trench isolation structures 124 can have straight portions 124A between adjacent radiation-sensing regions 122 and cross-road portions 124B where straight portions 124A intersect. Cross-road portions 124B can have width 124Bw greater than width 124Aw of straight portions 124A. In some embodiments, cross-road portions 124B between radiation-sensing regions 122 can be formed with third pattern 1136 or third pattern 2036 at the cross-road portion. As a result, cross-road portions 124B can have depth 124Bd, which is substantially the same as depth 124Ad of straight portions 124A. In some embodiments, straight portions 124A of trench isolation structures 124 can have a convex bottom surface 124As, and the cross-road portions 124B can have concave bottom surface 124Bs. In some embodiments, a difference of depth 124Ad and 124Bd can range from about 1 Å to about 8000 Å. A ratio of the difference to depth 124Ad of straight portions 124A can be less than about 20%. In some embodiments, with third pattern 1136 or 2036 at the cross-road portion, the depth uniformity of trench isolation structures 124 at straight and cross-road portions 124A and 124B can be improved by about 20% to about 40% and the device performance of semiconductor device 100 can be improved by about 5% to about 10%.

In some embodiments, a semiconductor structure includes a first trench fill structure on a substrate and a second trench fill structure on the substrate. The first trench fill structure has a first width and a convex bottom surface. The second trench fill structure has a concave bottom surface and a second width greater than the first width.

In some embodiments, a semiconductor device includes a first chip. The first chip includes multiple pixels on a first side of the first chip and first and second trench fill structures isolating the multiple pixels. The first trench fill structure has a convex bottom surface. The second trench fill structure is in contact with the first trench fill structure. The second trench fill structure has a concave bottom surface. The semiconductor device further includes a second chip bonded to a second side of the first chip. The second side is opposite to the first side.

In some embodiments, a method includes forming, on a substrate, a first pattern having a first width and a second pattern having a second width greater than the first width, forming, within the second pattern, a third pattern having a third width less than the second width, and forming, on the substrate, a first trench under the first pattern and a second trench under the second and third patterns.

It is to be appreciated that the Detailed Description section, and not the Abstract of the Disclosure section, is intended to be used to interpret the claims. The Abstract of the Disclosure section may set forth one or more but not all possible embodiments of the present disclosure as contemplated by the inventor(s), and thus, are not intended to limit the subjoined claims in any way.

The foregoing disclosure outlines features of several embodiments so that those skilled in the art may better understand the aspects of the present disclosure. Those skilled in the art will appreciate that they may readily use the present disclosure as a basis for designing or modifying other processes and structures for carrying out the same purposes and/or achieving the same advantages of the embodiments introduced herein. Those skilled in the art will also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
a first trench fill structure on a substrate, wherein the first trench fill structure has a first width and a convex bottom surface; and
a second trench fill structure on the substrate and intersecting with the first trench fill structure, wherein:
the second trench fill structure has a concave bottom surface; and
the second trench fill structure has a second width greater than the first width.

2. The semiconductor structure of claim 1, wherein the first trench fill structure has a first depth and the second trench fill structure has a second depth, and wherein a ratio of a difference between the first and second depths to the first depth is less than about 20%.

3. The semiconductor structure of claim 1, wherein the second trench fill structure further comprises a protrusion and a recess at the concave bottom surface, and wherein a distance between the protrusion and the recess ranges from about 10 Å to about 2000 Å.

4. The semiconductor structure of claim 3, wherein a ratio of the distance to a depth of the first trench fill structure ranges from about 0.02% to about 5%.

5. The semiconductor structure of claim 1, wherein the first trench fill structure has a depth, and wherein a ratio of the depth to the first width ranges from about 20 to about 100.

6. The semiconductor structure of claim 5, wherein the depth ranges from about 2 μm to about 4 μm.

7. The semiconductor structure of claim 1, wherein the second trench fill structure has a depth, and wherein a ratio of the depth to the second width ranges from about 5 to about 50.

8. The semiconductor structure of claim 1, wherein a ratio of the second width to the first width ranges from about 2 to about 100.

9. The semiconductor structure of claim 1, wherein the first width ranges from about 40 nm to about 100 nm and the second width ranges from about 80 nm to about 400 nm.

10. A semiconductor device, comprising:
a first chip, wherein the first chip comprises:
a plurality of pixels on a first side of the first chip; and
first and second trench fill structures isolating the plurality of pixels from one another, wherein:
the first and second trench fill structures have a substantially same depth;
the first and second trench fill structures have different widths;
the first trench fill structure has a convex bottom surface;
the second trench fill structure is in contact with the first trench fill structure; and
the second trench fill structure has a concave bottom surface; and
a second chip bonded to a second side of the first chip, wherein the second side is opposite to the first side.

11. The semiconductor device of claim 10, wherein the first trench fill structure has a first depth and the second trench fill structure has a second depth, and wherein a ratio of a difference between the first and second depths to the first depth is less than about 20%.

12. The semiconductor device of claim 10, wherein the second trench fill structure comprises a protrusion and a recess at the concave bottom surface, and wherein a ratio of a distance between the protrusion and the recess to a depth of the first trench fill structure ranges from about 0.02% to about 5%.

13. The semiconductor device of claim 10, wherein the first trench fill structure has a first width and the second trench fill structure has a second width, and wherein a ratio of the second width to the first width ranges from about 2 to about 100.

14. A method, comprising:
forming, on a substrate, a first pattern having a first width and a second pattern having a second width greater than the first width;
forming, within the second pattern, a third pattern having a third width less than the second width; and
forming, on the substrate, a first trench under the first pattern and a second trench under the second and third patterns.

15. The method of claim 14, wherein forming the first pattern and the second pattern comprises:
depositing a mask layer on the substrate; and
etching the mask layer into the first and second patterns.

16. The method of claim 14, wherein forming the third pattern comprises:
depositing a dielectric material on the first and second patterns;
forming a mask structure on the dielectric material above the second pattern; and
etching the dielectric material and the mask structure.

17. The method of claim 14, wherein forming the first pattern and the second pattern comprises:
depositing a first etch stop layer on the substrate;
depositing a mask layer on the first etch stop layer;
depositing a second etch stop layer on the mask layer; and
etching the mask layer and the second etch stop layer.

18. The method of claim 17, wherein forming the third pattern comprises:
depositing a dielectric material on the first and second patterns to fill the first pattern;
depositing a coating layer on the dielectric material to fill the second pattern;
etching the coating layer and the dielectric material to form a mask structure in the second pattern; and
removing the first etch stop layer exposed by the first pattern, the mask structure, and the second pattern.

19. The method of claim 14, wherein forming the first trench and the second trench comprises etching the substrate having the first, second, and third patterns with a fluorine-based plasma.

20. The method of claim 14, further comprising filling the first and second trenches with a dielectric material.

* * * * *